(12) United States Patent
Crockett et al.

(10) Patent No.: US 8,976,979 B2
(45) Date of Patent: *Mar. 10, 2015

(54) AUDIO SIGNAL DYNAMIC EQUALIZATION PROCESSING CONTROL

(75) Inventors: Brett G. Crockett, Brisbane, CA (US); Alan J. Seefeldt, San Francisco, CA (US); Brian D. Link, San Jose, CA (US); John D. Couling, San Mateo, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 392 days.

This patent is subject to a terminal disclaimer.

(21) Appl. No.: 13/300,480

(22) Filed: Nov. 18, 2011

(65) Prior Publication Data

US 2012/0063614 A1 Mar. 15, 2012

Related U.S. Application Data

(63) Continuation of application No. PCT/US2010/034559, filed on May 12, 2010.

(60) Provisional application No. 61/181,206, filed on May 26, 2009.

(51) Int. Cl.
*H03G 5/00* (2006.01)
*G10L 21/02* (2013.01)
(Continued)

(52) U.S. Cl.
CPC ...... *G10L 21/0205* (2013.01); *G11B 20/10527* (2013.01); *H03G 5/165* (2013.01); *G11B 2020/10546* (2013.01); *G11B 2020/10555* (2013.01); *G11B 2020/10564* (2013.01)
USPC ............................................ 381/98; 381/119

(58) Field of Classification Search
USPC ............ 381/98, 74, 103, 58, 59, 93, 28, 108, 381/104, 119; 333/28; 379/406.01–406.09; 704/226
See application file for complete search history.

(56) References Cited

U.S. PATENT DOCUMENTS 6,182,030 B1    1/2001    Hagen
6,341,166 B1    1/2002    Basel
(Continued)

FOREIGN PATENT DOCUMENTS

EP    1437828         7/2004
EP    1437828 A2 *   7/2004
(Continued)

OTHER PUBLICATIONS

Transform Coding, Wikipedia.*
(Continued)

*Primary Examiner* — Vivian Chin
*Assistant Examiner* — Ammar Hamid
(74) *Attorney, Agent, or Firm* — Dov Rosenfeld; Inventek

(57) ABSTRACT

Apparatuses for and methods of carrying out dynamic equalization processing of an audio signal, and apparatuses for and methods of controlling such equalization processing of the audio signal to dynamically adjust the time-varying spectrum of an audio signal to more closely match a user specified target time-invariant perceived audio signal spectrum while preserving the original dynamic range of the audio signal. The dynamic equalization is according to a user-defined spectral profile specified by a control interface that allows a user to define, create, modify and/or apply the user-defined spectral profile.

27 Claims, 14 Drawing Sheets

(51) Int. Cl.
   *G11B 20/10*   (2006.01)
   *H03G 5/16*   (2006.01)
   *H04B 1/00*   (2006.01)

(56) References Cited

U.S. PATENT DOCUMENTS

| | | | |
|---|---|---|---|
| 6,704,421 | B1 | 3/2004 | Kitamura |
| 7,194,096 | B2 * | 3/2007 | Graumann ................. 381/103 |
| 2002/0001395 | A1 | 1/2002 | Davis |
| 2003/0108209 | A1 | 6/2003 | McIntosh |
| 2003/0235317 | A1 | 12/2003 | Baumgarte |
| 2005/0195995 | A1 | 9/2005 | Baumgarte |
| 2005/0249272 | A1 | 11/2005 | Kirkeby |
| 2005/0265560 | A1 | 12/2005 | Haulick |
| 2007/0092089 | A1 | 4/2007 | Seefeldt |
| 2007/0174059 | A1 | 7/2007 | Rhoads |
| 2007/0291959 | A1 | 12/2007 | Seefeldt |
| 2008/0044087 | A1 | 2/2008 | Levy |
| 2008/0075303 | A1 | 3/2008 | Kim |
| 2008/0080607 | A1 | 4/2008 | Shah |
| 2009/0048848 | A1 | 2/2009 | Krig |
| 2009/0097676 | A1 | 4/2009 | Seefeldt |

FOREIGN PATENT DOCUMENTS

| | | |
|---|---|---|
| RU | 2241305 | 11/2004 |
| RU | 2279758 | 7/2006 |
| RU | 2284648 | 9/2006 |
| WO | WO 2004111994 | 12/2004 |
| WO | WO 2005121950 | 12/2005 |
| WO | WO 2006047600 | 5/2006 |
| WO | WO 2007047037 | 4/2007 |
| WO | WO 2007120453 | 10/2007 |
| WO | WO 2007120453 A1 * | 10/2007 |
| WO | WO 2008113012 | 9/2008 |
| WO | WO 20080105070 | 9/2008 |

OTHER PUBLICATIONS

Seefeldt, Alan, "Loudness Domain Signal Processing" AES Convention Paper 7180, presented at the 123rd Convention Oct. 5-8, 2007, New York, USA.

Wikipedia, The Free Encyclopedia, "Equalization Filter" Oct. 3, 2006, Wikimedia Foundation, Inc. Retrieved Dec. 6, 2011 from http://en.wikipedia.org/w/index.php?title=Equalization_filter&oldid=79195244.

Wikipedia, The Free Encyclopedia, "Equalization", Wikimedia Foundation, Inc. Retrieved Nov. 26, 2008 from http://en.wikipedia.org/wiki/Equalization.

Trapani et al: "Signal Processing Through Dynamic Equalization", 79th Convention of the Audio Engineering Society, Oct. 1985, 2309 (D-16).

International Search Report and Written Opinion of the Intellectual Searching Authority on PCT Application PCT/US2010/034559 mailed Aug. 5, 2010.

International Preliminary Report on Patentability on PCT Application PCT/US2010/034559 mailed Jul. 13, 2011.

PowerCore, "Manual for PowerCore," 2007, available from TC Electronics A/S, Sindalvej 34, Rissov DK-8240, Denmark. Downloaded Dec. 11, 2008 at http://www.tcelectronic.com/media/Powercore_01 (1).pdf.

Soundtrack Pro: How to use the Match EQ plug-in, dated Jun. 20, 2007, downloaded Dec. 10, 2008 at http://support.apple.com/kb/TA23246?viewlocale=en_US.

Craig Anderton, "Curves of Steal: Fabulous Frequency Felons", Downloaded Dec. 11, 2008 at http://www.harmony-central.com/articles/tips/curves_of_steal/.

Apple Computer, Inc., 2004, "Logic Pro 7 Plug in Reference," Apple Computer, Inc., 1 Infinite Loop, Cupertino, CA 95014-2084.

Sony Creative Software Inc., XFX 2 DirectX Audio Plug-Ins, Downloaded Dec. 11, 2008 at http://www.sonycreativesoftware.com/products/showproduct.asp?PID=8&FeatureID=244.

Aleksey Vaneev, "Voxengo: CurveEQ", Downloaded Dec. 11, 2008 at http://www.voxengo.com/product/curveeq/.

Wikipedia, The Free Encyclopedia, "Cryptographic hash function", Wikimedia Foundation, Inc. Retrieved Jul. 7, 2009 from http://en.wikipedia.org/wiki/Cryptographic_hash_function.

International Search Report and Written Opinion of the Intellectual Searching Authority on PCT Application PCT/US2010/034683 mailed Oct. 19, 2010.

International Preliminary Report on Patentability on PCT Application PCT/US2010/034683 mailed Oct. 11, 2011.

* cited by examiner

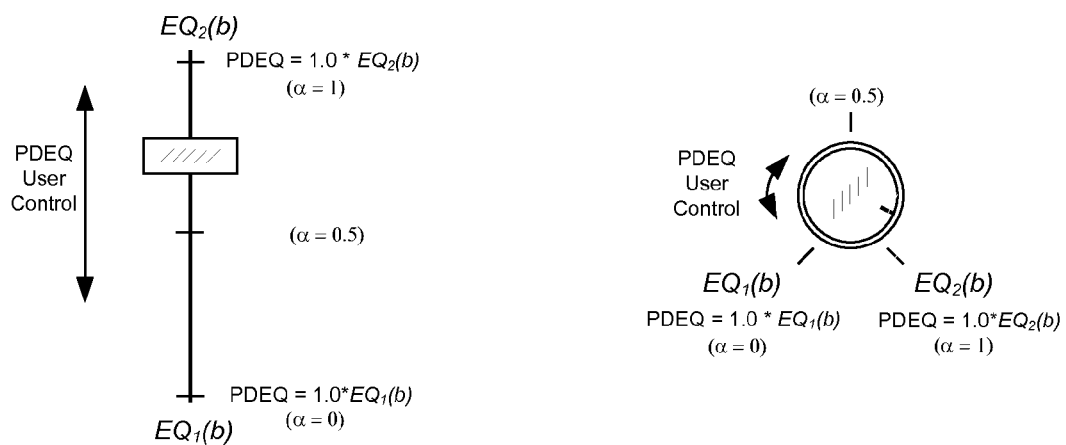
FIG. 5A          FIG. 5B

AUDIO SIGNAL DYNAMIC EQUALIZATION PROCESSING CONTROL

RELATED APPLICATIONS

The present application is a continuation filed under 35 U.S.C. 111(a) of International Patent Application No. PCT/US2010/034559 having International Filing Date 12 May 2010 titled AUDIO SIGNAL DYNAMIC EQUALIZATION PROCESSING CONTROL, the contents of which are incorporated herein by reference. International Patent Application No. PCT/US2010/034559 claims priority of U.S. Provisional Patent Application No. 61/181,206 filed 26 May 2009 and titled AUDIO SIGNAL DYNAMIC EQUALIZATION PROCESSING CONTROL, the contents of which are incorporated herein by reference.

FIELD OF THE INVENTION

The present disclosure relates generally to signal processing of media data, such as signal processing of signal data for quality enhancement.

BACKGROUND

Equalization processing of an audio signal is commonly used to alter the frequency response of an audio signal to be within a user specified range and is typically achieved by using an equalization filter whose frequency response can be adjusted by a user for one or more reasons, such as the resulting audio signal having improved fidelity, emphasizes certain frequencies or ranges of frequencies, has undesired frequency components such as noise removed, and/or matches perceived timbre of multiple audio signal pieces, such as songs on a CD or multiple compressed MP3 audio signal files. Audio signal equalization is also commonly used in film and television production to improve the quality of the sound, modify and/or match the timbre of audio signal in different scenes or to match individual audio signal streams which comprise a film or television soundtrack. Audio signal equalization can also be used to modify specific frequencies and to make audio signal perceptually louder, as well as to compensate for frequency dependent deficiencies in an audio signal reproduction system.

Many types of equalizations are known. Such equalizations, however, do not take into account the time varying nature of the audio signal itself.

Recently, perceptual domain processing has been invented that takes into account the variation in the perception of audio depending on the reproduction level of the audio signal. See, for example, International Application PCT/US2004/016964, published as WO 2004111994. Such processing includes determining and adjusting the perceived loudness of an audio signal in an improved manner. A psychoacoustic model is used to calculate a measure of the loudness of an audio signal in perceptual units. Such perceptual domain loudness measure is referred to as specific loudness, and is a measure of perceptual loudness as a function of frequency and time. When applied to equalization, true dynamic equalization is carried out in a perceptual domain to transform the time-varying perceived spectrum of the audio signal to be closer to a desired time-invariant perceived spectrum. This form of equalization matches a desired target perceived spectrum while preserving the perceived dynamic range. This takes into account the dynamic range and perceived loudness of the audio signal.

While it is known how to achieve such perceptual domain dynamic equalization processing, it would be advantageous to provide mechanisms for controlling one or more properties of the equalization. Example of such control include in the case of a single preset target perceived spectrum, how much equalization to achieve. In the case of more than one preset target perceived spectra, controlling how much the ultimate target perceived spectrum includes each of the preset spectra.

BRIEF DESCRIPTION OF THE DRAWINGS

FIG. 5A shows a basic slider control interface for dynamic equalization on a media device for application of two dynamic equalization preset spectral profiles according to some embodiments of the present invention.

FIG. 5B shows a basic knob control interface for dynamic equalization on a media device for application of two dynamic equalization preset spectral profiles according to some embodiments of the present invention.

DESCRIPTION OF EXAMPLE EMBODIMENTS

Overview

Figure 1:
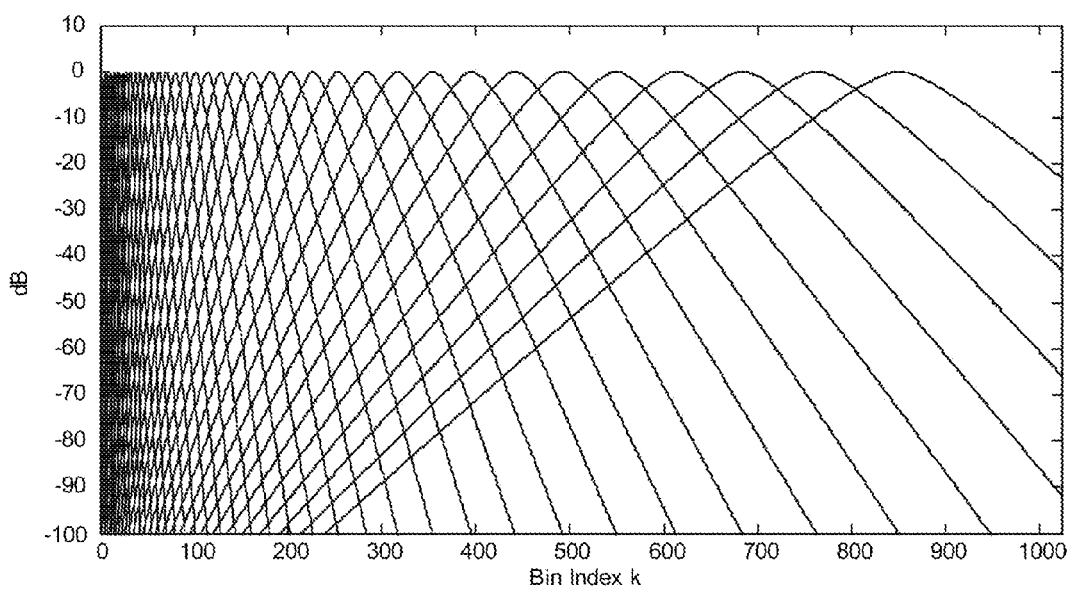
FIG. 1 shows a set of filters spaced uniformly on the Equivalent Rectangular Bandwidth (ERB) scale and used to determine frequency bands for perceptual domain processing according to embodiments of the present invention.

Described herein are apparatuses for and methods of carrying out dynamic equalization processing of an audio signal, such as perceptual domain dynamic equalization and other types of dynamic equalization, and apparatuses for and methods of controlling such equalization processing of the audio signal to dynamically adjust the time-varying spectrum of an audio signal to more closely match a user specified target time-invariant audio signal spectrum. Also described herein are computer readable media that include instructions that when executed by one or more processors of an audio signal processing apparatus carry out the methods.

Also presented herein are improved approaches for users of media devices—in general, audio signal processing apparatuses—to create, modify and apply the target time-invariant audio signal spectra used in dynamic equalization processing.

One embodiment includes a method of operating an audio signal processing apparatus to process an audio signal. The method includes accepting from a control interface a user-defined dynamic equalization (DEQ) spectral profile based on a blending of one or more selected DEQ preset spectral profiles. The blending is based on a set of one or more blending parameters. The control interface provides a mechanism for a user to set the one or more blending parameters. The blending parameter for the case of a single DEQ preset spectral profile is a parameter indicative of the amount of DEQ to apply according to the single DEQ preset spectral profile. The method further includes processing an audio signal according to the user-defined PDEQ spectral profile to generate a processed audio signal. The processing including determining a spectral measure that is modified to dynamically adjust the time-varying spectrum of the audio signal to match a time invariant spectral profile according to the user-defined DEQ spectral profile. In the case of perceptual domain dynamic equalization (PDEQ), the processing including determining a perceptual domain spectral measure that is modified to dynamically adjust the time-varying perceived spectrum of the audio signal to match the time invariant spectral profile according to the user-defined DEQ spectral profile.

In some embodiments of the method, the control interface including one or more control elements configured to accept a user input, and the method includes presenting the control interface to the user so that the user can apply an input mechanism to control the control element(s).

In some embodiments of the method, the control interface further includes at least one control element for selecting the one or more DEQ preset spectral profiles from a set of DEQ preset spectral profiles.

Different embodiments include different types of control elements, such as virtual or actual slider control elements, and/or virtual or actual rotary control elements. Some embodiments include a two-dimensional control element configured to accept a user indication of a location on an area defining the two-dimensional control element.

One embodiment includes a computer-readable medium configured with instructions that when executed by one or more processors of a media processing apparatus cause carrying out a method. The method is as described in the above four paragraphs.

One embodiment includes a media processing apparatus that includes one or more processors configured to determine a user-defined dynamic equalization (DEQ) spectral profile by blending one or more selected DEQ preset spectral profiles based on a set of one or more blending parameters. In the case of a single selected DEQ preset spectral profile, there is a single blending parameter indicative of the amount of DEQ to apply according to the single DEQ preset spectral profile. The one or more processors are further configured to process an audio signal according to the user-defined DEQ spectral profile to generate a processed audio signal, the processing including determining a spectral measure that is modified to dynamically adjust the time-varying spectrum of the audio signal to match a time invariant spectral profile according to the user-defined DEQ spectral profile. In the case of perceptual domain dynamic equalization (PDEQ), the processing including determining a perceptual domain spectral measure that is modified to dynamically adjust the time-varying perceived spectrum of the audio signal to match the time invariant spectral profile according to the user-defined DEQ spectral profile. The media processing apparatus further includes a storage subsystem, and a control interface including one or more control elements configured to accept a user input including values for at least some of the set of one or more blending parameters for defining the user-defined DEQ spectral profile. In some versions, the storage subsystem is configured with instructions that when executed by one or more of the processors, cause the determining of the user-defined DEQ spectral profile and the process of the audio signal.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Background Art: Traditional Equalization

Many kinds of traditional equalization filters are known, and each has a different behavior in regards to the frequencies that they attenuate or boost. With traditional equalization, filtering is applied to an audio signal in order to change its spectrum. A peak equalizer raises or lowers a range of frequencies around a central point in a bell shape. A peaking equalizer with controls to adjust the level (gain), bandwidth (denoted by Q) and center frequency is called a parametric equalizer, with the parameters the gain, bandwidth, and center frequency. A similar peaking equalizer but with no control of the bandwidth, e.g., a bandwidth fixed by the filter designer, is sometimes called a quasi-parametric equalizer or a semi-parametric equalizer.

A pass filter equalizer attenuates either high or low frequencies while allowing other frequencies to pass unfiltered. Such filters include a low pass filter, a high pass filter, and a band pass filter, which combines the properties of a high pass and low pass filter.

Shelving-type equalizers increase or attenuate the level of a wide range of frequencies by a fixed amount. A low shelf will affect low frequencies up to a certain point and then above that point will have little effect. A high shelf affects the level of high frequencies, while below a certain point, the low frequencies are unaffected.

In many equalization hardware and software implementations, it is not uncommon for all three types of equalizer filters, peak, pass and shelving to be part of the signal processing path to modify an audio signal.

Another common type of equalizer is a graphic equalizer, which includes controllers such as a bank of sliders or other controllers for boosting and cutting different bands (frequency ranges) of an audio signal. Normally, these bands are tight enough to give at least 3 dB or 6 dB maximum effect for neighboring bands, and cover the range from around 20 Hz to 20 kHz.

An example of a simple graphic equalizer is a 4-band equalizer that might have bands at 20 Hz, 200 Hz, 2 kHz and 20 kHz. A typical graphic equalizer for live sound reinforcement might have as many as 24 or 31 bands.

Spectral matching equalization is known in which it is desired to match the frequency response of a target audio signal to that of a reference audio signal. An audio engineer listens to the reference audio and manually creates an equalization setting that will make the target sound like the reference. Such manual spectral matching equalization can be very time consuming and often still yield unsatisfactory results, e.g., because of the time varying nature of the target.

In recent years several automatic spectral matching equalization methods have become available. These methods are often provided in the form of a software plug-in for a digital audio signal workstation. Examples of commercially available solutions include Match EQ™, part of the LogicPro7™ Plug-in by Apple Computer, Inc., of Cupertino, Calif., Freefilter by Steinberg Media Technologies GmbH, of Hamburg, Germany, and CurveEQ™ by Aleksey Vaneev ("Voxengo") of Syktyvkar, Komi Republic, Russia. Such methods typically operate as follows: first a reference audio signal is analyzed to generate an averaged static reference spectrum. A target audio signal is also analyzed to generate a second averaged static reference spectrum. The two spectra are compared to create static equalizer that attempts to match the spectral characteristics of the target audio signal to those of the reference audio signal. Because the resulting equalizer does not take into account the time varying spectrum of the target audio signal, the results are often unsatisfactory. Automatic spectral matching equalization is also highly dependent on the user selected audio signal for the first two analysis steps, particularly the analysis of the target audio signal.

Recently there have been attempts to carry out equalization that combined dynamic range compression with multi-band equalization. Examples include Dynamic EQ™ by T.C. Electronic A/S of Risskov, Denmark, and Multi-Band Dynamics™, part of the XFX2™ suite of plug-ins by Sony Creative Software Inc., of Madison, Wis. Four definable bands can be configured to work in either static or dynamic modes, or a mixture of both. Each band can be configured as a parametric equalizer or as a high or low shelving filter. Each band also includes compression, using compression parameters such as threshold, attack time, release time and gain. The compression does take into account the underlying time-varying nature of the audio signal being processed, but does so in a rather coarse manner.

Perceptual Domain Dynamic Equalization (PDEQ)

A more satisfying true dynamic equalization method is carried out in a perceptual domain to transform the perceived spectrum of the audio signal from a time-varying perceived spectrum to be closer to a substantially time-invariant perceived spectrum. This form of equalization matches a desired target perceived spectrum while preserving the perceived dynamic range. This takes into account the dynamic range and perceived loudness of the audio signal. The process is called Perceptual Domain Dynamic EQ or PDEQ herein, and refers to an audio signal equalization method that includes intentional transformation of an audio signal's time-varying spectrum to match more closely a target time-invariant spectrum while still preserving the original dynamic range of the audio signal.

With traditional static equalization, a simple fixed filtering is applied to the audio signal in order to change its spectrum. For example, one might apply a fixed bass or treble boost with simple shelving EQs. However, such processing does not take into account the spectrum of the audio signal being processed and may therefore be inappropriate for some signals. As one example, audio signals that already contain a relatively large amount of bass or treble may become unacceptable to a listener following additional frequency boosting. With PDEQ, the time-varying spectrum of the signal is measured and the signal is then dynamically modified in order to transform the measured spectrum to more closely match a desired static shape. If the spectrum of the audio signal is already close to that of the desired shape, then little modification is made to the audio signal. If the spectrum is significantly different from the desired shape, then the resulting modifications may be large. These modifications adapt over time as the spectrum of the processed audio signal changes relative to the spectrum of the desired shape.

Seefeldt recently described PDEQ in International Patent Application No. PCT/US2005/038579 published as WO 2006047600 titled CALCULATING AND ADJUSTING THE PERCEIVED LOUDNESS AND/OR THE PERCEIVED SPECTRAL BALANCE OF AN AUDIO SIGNAL and International Patent Application No. PCT/US20075/007946 published as WO 2007120453 titled CALCULATING AND ADJUSTING THE PERCEIVED LOUDNESS AND/OR THE PERCEIVED SPECTRAL BALANCE OF AN AUDIO SIGNAL. Each of these applications designates the United States. The contents of each of such patent applications published as WO 2006047600 and WO 2007120453 are incorporated herein by reference. See also Alan Seefeldt: "Loudness Domain Signal Processing," paper 7180, *Proceedings*, 123rd *Convention of the Audio engineering Society*, New York, N.Y., USA, 5-8 Oct. 2007.

The above-mentioned Seefeldt publications described audio signal quality enhancement signal processing methods that occur in what is called the perceptual domain. PDEQ processing methods include determining modification parameters from calculations carried out in a perceptual domain, and modifying audio signal data according to the modification parameters. By determining the modification parameters in the perceptual domain, greater control over perceptual loudness and perceived spectral balance may be achieved than if such modification parameters were derived in the electrical signal domain. In some embodiments, a basilar-membrane simulating psychoacoustic filterbank or its equivalent is used for performing loudness domain calculations. This can provide a more detailed control of the perceived spectrum than in arrangements that derive modification parameters in the electrical signal domain.

Processing in a Perceptual Domain

Often, an audio signal is expected to be reproduced at a specified reference level. However, many times, the media data is played back at reduced levels. It is known that there is variation in the perception of audio depending on the reproduction level. Such variation is related to psychoacoustics and the equal loudness contours and the threshold of hearing in quiet. Altered playback levels can result in dramatic differences in timbre and spatial perception of the audio when compared to the same media data played back at reference level. The perceptual domain dynamic equalization as described in embodiments of the present invention includes determining and adjusting the perceived loudness of an audio signal in an improved manner. A psychoacoustic model is used to calculate a measure of the loudness of an audio signal in perceptual units. Such perceptual domain loudness measure is referred to as specific loudness, and is a measure of perceptual loudness as a function of frequency and time. As one example, a dynamic equalization process includes determining parameters in a perceptual domain includes using a signal processing method to compute frequency and time-varying multiplicative gains, which, when applied to the audio, results in the spectral properties of the gain-modified audio being closer to a preset or user defined equalization or spectral balance profile. The gain adjusting methods also include signal processing methods that analyze and modify the audio depending on playback level restoring it to the way it would be perceived at the reference playback level having the preset or user defined equalization.

Because specific loudness is a measure of perceptual loudness of an audio signal as a function of frequency and time, in order to process a signal so that its spectral properties become closer to a substantially time invariant shape, the spectrum of the to-be-modified audio signal is generated by smoothing the specific loudness of the signal over time.

To reduce the difference between the specific loudness of the audio signal and the target specific loudness, the modifying typically modifies the audio signal as a function of both time and frequency. In the case of a time- and frequency-varying scale factor, the specific loudness may be scaled by the ratio of a measure of a desired spectral shape to the measure of a spectral shape of the audio signal. Such a scaling may be used to transform the perceived spectrum of the audio signal from a time-varying perceived spectrum to be closer to a substantially time-invariant perceived spectrum. When the specific loudness is scaled by the ratio of a measure of a desired spectral shape to the measure of a spectral shape of the audio signal, such a scaling may be usable as a perceptual domain dynamic equalizer.

One version of PDEQ includes processing each of a plurality of frequency bands by time varying gain factors that are determined from characteristics in the perceptual loudness domain. As discussed in WO 2006047600 and WO 2007120453, and for aspects of the present invention, a time sampled audio signal denoted x[n], where n is an integer sample index is pre-processed to generate a time-varying spectrum denoted by a function L[b,t], indicating a signal level denoted L within a plurality of frequency bands (critical bands), e.g., 40 bands, each denoted by a band number denoted by integer b varying over time blocks each time block denoted by an integer t. The function L[b,t] of the audio signal may be generated in a number of ways, but advantageously the bands b are spaced to simulate the frequency resolution of human hearing. The goal of PDEQ processing is to modify x[n] so that the modified audio more closely matches a desired time-invariant perceptual domain spectral shape that is specified across bands b by a quantity denoted EQ[b].

In the perceptual domain, starting with the audio signal samples x[n], a quantity called an excitation signal denoted E[b,t] is computed that approximates the distribution of energy along the basilar membrane of the inner ear of a human at a critical frequency band b during a time block t. While other transforms, such as the modified discrete cosine transform (MDCT) also may be used, the perceptual domain excitation may be achieved efficiently by computing the running Short-Time Discrete Fourier Transform (STDFT) of the audio signal denoted x[n], n=0, ..., N−1, the STDFT denoted by X[k,t], k=0, 1, ... N−1, and is computed with half overlap and window denoted w[n] according to:

$$X[k, t] = \sum_{n=0}^{N-1} w[n]x[n + tN/2]e^{-j\frac{2\pi kn}{N}} \quad (1)$$

with $j^2 = -1$.

The excitation in some embodiments is computed according to:

$$E[b, t] = \sum_{k=0}^{N-1} |T[k]|^2 |C_b[k]|^2 |X[k, t]|^2 \quad (2)$$

where T[k] represents the frequency response of a filter simulating the transmission of audio through the outer and inner ear of a human, and $C_b$[k] are a selected set of bandpass filters. In one embodiment, the set of bandpass frequency responses $C_b$[k] be advantageously chosen to mimic the critical band filtering observed along the basilar membrane in the human ear at critical frequency b. As discussed in WO 2006047600 and WO 2007120453, these filters exhibit an approximately rounded exponential shape and are spaced uniformly on the Equivalent Rectangular Bandwidth (ERB) scale. Example embodiments of the present invention use set of filters with a spacing of 1 ERB, resulting in a total of 40 bands. FIG. 1 depicts a suitable set of filters with a spacing of 1 ERB, resulting in a total of 40 bands.

The specific loudness denoted N[b,t] is a spectral representation meant to simulate the manner in which a human perceives audio as a function of frequency and time. As described in WO 2006047600 and WO 2007120453, the specific loudness in general as a transformation denoted by Ψ{ }, such that $$N[b,t]=\Psi\{E[b,t]\}. \quad (3)$$

PDEQ Processing

A PDEQ process computes a measured spectrum in the perceptual domain and modifies the signal such that a desired shape spectral denoted by Eq[b] is achieved. A multi-band perceptual-domain loudness is denoted by $L_p$[b,t], and is a function of the input audio signals specific loudness N[b,t]. While one simple embodiment sets $L_p$[b,t] to be the specific loudness N[b,t], in some embodiments, in order to avoid instability of the processing over time segments t, the specific loudness N[b,t] is first smoothed over time, e.g., uses a single smoothing coefficient λ to provide the smoothed specific loudness denoted $\overline{N}$[b,t] as:

$$\overline{N}[b,t]=\lambda\overline{N}[b,t-1]+(1-\lambda)N[b,t]. \quad (4)$$

Note that, as described in WO 2006047600 and WO 2007120453, alternate embodiments might include smoothing the excitation rather than the specific loudness, in which case, the smoother excitation denoted $\bar{E}[b,t]$ is given by:

$$\bar{E}[b,t]=\lambda \bar{E}[b,t-1]+(1-\lambda)E[b,t], \qquad (5)$$

and Eqn. 3 for the specific loudness becomes:

$$\bar{N}[b,t]=\Psi\{\bar{E}[b,t]\} \qquad (6)$$

Other embodiments can use different smoothing methods, for example, including a recursive relation involving more than just the most previous time's smoothed specific loudness $\bar{N}[b,t-1]$ in the case of smoothing the specific loudness, or previous time's smoothed excitation $\bar{E}[b,t-1]$ in the case of smoothing the excitation. Furthermore, the multi-band loudness (the spectrum), $L_p[b,t]$ may be calculated by smoothing the specific loudness $\bar{N}[b,t]$ across bands so that there is not a drastic change from one band to the next. In the case of using the smoothed specific loudness, the result is a band-smoothed loudness denoted $\bar{L}_p[b,t]$ with a smoothing filter is applied:

$$\bar{L}_p[b,t] = \sum_c Q(b-c)\bar{N}[c,t] \qquad (7)$$

where Q(b) is a band smoothing filter.

To preserve the original dynamic range of the audio signal, the desired spectral shape EQ[b] may be normalized to have the same overall level as the smoothed signal loudness denoted $\bar{L}_p[b,t]$ to generate a normalized spectral shape denoted $EQ_{NORM}[b,t]$ as:

$$EQ_{NORM}[b,t] = \left(\frac{\sum_c \bar{L}_p[c,t]}{\sum_c EQ[c]}\right)EQ[b]. \qquad (8)$$

The processing is to modify the specific loudness N[b,t] to achieve a target specific loudness denoted $\hat{N}[b,t]$ such that the resulting spectral shape is closer to the desired shape EQ[b]. Again, letting the function $\Psi\{\cdot\}$ denote the non-linear transformation from excitation to specific loudness, i.e., $N[b,t]=\Psi\{E[b,t]\}$, where the excitation may be the smoothed excitation, one embodiment determines a set of time varying multi-band gains $G_p[b,t]$ forming a time varying filter according to the relationship.

$$\hat{N}[b,t]=\Psi\{G_p^2[b,t]E[b,t]\}, \qquad (9)$$

where E[b,t] is in one embodiment the smoothed excitation.

The gains $G_p[b,t]$ are applied in the frequency domain to a delayed version of X[k,t] that is obtained by the STDFT (or MDCT), where the delay is to account for the time needed to compute the gains. The resulting gain multiplied signal:

$$\hat{X}[k,t]=G_p[k,t]X[k,t-d]$$

where d denotes the delay time, is then applied to a set of synthesis filters, denoted $S_b[k]$ for frequency band b to generate a signal denoted $\hat{X}[k,t]$ where $$\hat{X}[k,t] = \sum_b G_p[k,t]S_b[k]X[k,t-d] \qquad (10)$$

Solving for the gains can take on many forms. If the inverse $\Psi_{-1}\{\cdot\}$ of the transformation $\Psi\{\cdot\}$ exists, then $$G_p[b,t] = \sqrt{\frac{\Psi^{-1}\{\hat{N}[b,t]\}}{E[b,t]}} \qquad (11)$$

where the excitation may be the smoothed excitation. If a closed form of $\Psi^{-1}\{\cdot\}$ does not exist, then the gains may be solved for by an iterative method, or by pre-computing $\Psi\{\cdot\}$ and using table look-up.

As described in WO 2006047600 and WO 2007120453, for perceptual domain dynamic equalization, the target specific loudness is related to the specific loudness by:

$$\hat{N}[b,t] = \left(\frac{\bar{L}_p[b,t]}{EQ_{NORM}[b,t]}\right)^{1-\beta} \frac{EQ_{NORM}[b,t]}{\bar{L}_p[b,t]} N[b,t] \qquad (12)$$

where β is a user-specified parameter ranging from zero to one, indicating the degree of PDEQ processing that is to be applied to the audio signal. Note that $$\Psi\{G_p^2[b,t]E[b,t]\} = \left(\frac{\bar{L}_p[b,t]}{EQ_{NORM}[b,t]}\right)^{1-\beta} \frac{EQ_{NORM}[b,t]}{\bar{L}_p[b,t]} \Psi\{E[b,t]\} \qquad (13)$$

from which the gains $G_p[b,t]$ may be determined.

From Eqn. 12, one notes that when $\beta=0, \hat{N}[b,t]=N[b,t]$ for all bands b and therefore the original signal is unmodified. When β=1, the scaling of the desired to actual specific loudness is equal to the ratio of the normalized desired specific loudness shape to the smoothed signal specific loudness spectrum, thereby transforming the smoothed spectral shape of the original audio signal completely to that of the desired shape EQ[b], expressed in the perceptual domain. In such a case, $$\Psi\{G_p^2[b,t]E[b,t]\} = \frac{EQ_{NORM}[b,t]}{\bar{L}_p[b,t]} \Psi\{E[b,t]\}$$

from which the gains $G_p[b,t]$ may be determined.

A PDEQ Processing Example

Figure 2A:
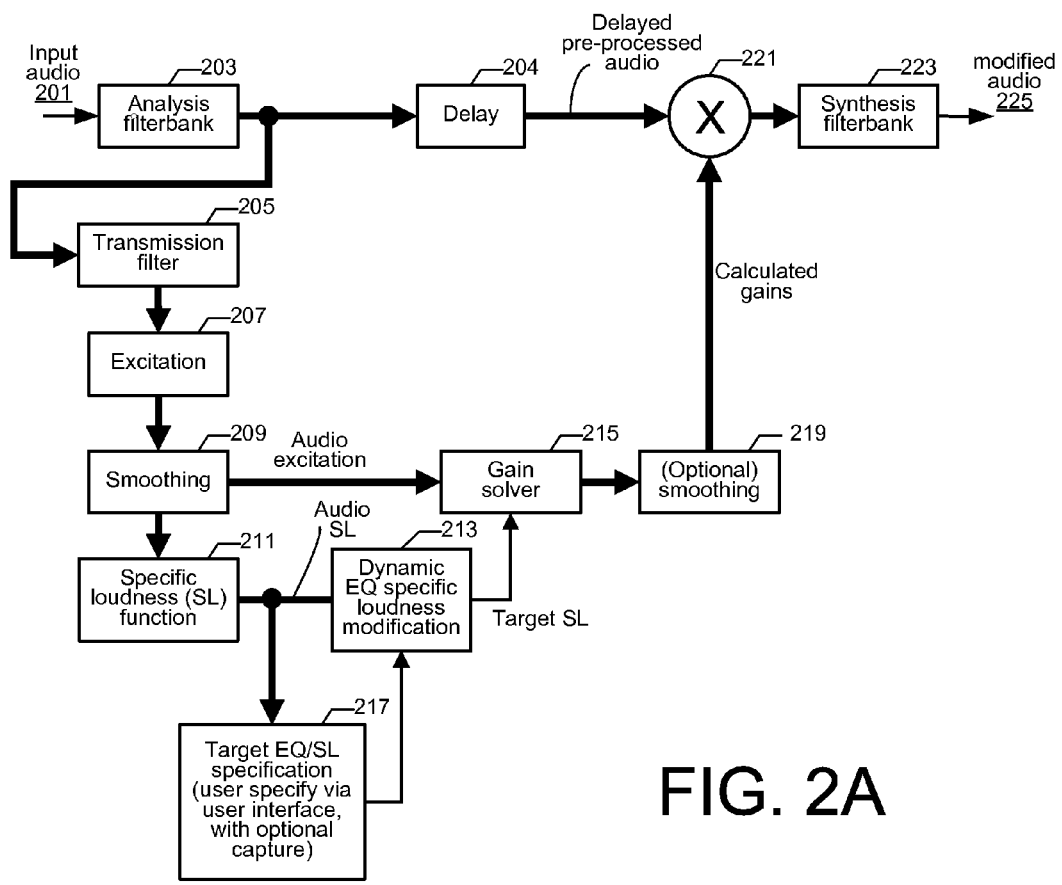
FIG. 2A shows a simplified block diagram of a feed-forward embodiment of perceptual domain dynamic equalization signal processing apparatus in which pre-processing separates an input audio signal into frequency bands.

FIG. 2A shows a simplified block diagram of a feed-forward embodiment of a PDEQ apparatus in which pre-processing separates an input audio signal into frequency bands. In practical embodiments, the processing of the audio is carried out in the digital domain, so that sampling and digitizing of analog signals is carried out. Such details are left out of this description, and would be clear to those skilled in the art.

The apparatus of FIG. 2A may be included, for example, in a media device or some other audio device for playing back audio. An apparatus that processes audio signals, such as a media device, is called an audio signal processing apparatus herein.

The arrangement shown in FIG. 2A is used to carry out PDEQ as described above, e.g., in Eqns. 1 through 13, with the addition of a control interface including a control interface with one or more control elements configured to accept a user input for specifying the equalization, as described in more detail herein below.

The term "control interface" is used herein for describing the combination of the visual or tactile presentation to a user of one or more control elements configured to accept a user input via one or more input mechanism. The control elements thus can be manipulated via respective input mechanisms. The term "input mechanism" of course should not be taken to only suggest only physical mechanical control, but also to include any agency or means by which input is provided by a user. Thus, the control element may include "virtual" controls such as virtual knobs, sliders, touch pads, and so forth, that include a display and some manner of accepting user input (the input mechanism) to manipulate the virtual control(s). Thus, in some embodiments, the control interface includes a user interface of one or more control elements displayed on a display device, and a user input method or device or subsystem for accepting user input of one or more of the displayed control elements. In other embodiments, the control interface includes physical control elements that can be manipulated by the user to provide the user input, e.g., one or more knobs, one or more slide controls, and/or one or more two dimensional controls such as a touch pad configured to accept a user indication of a location on the touch pad.

The Audio 201 first passes through an analysis filterbank function or device 203, which splits the audio signal into a plurality of frequency bands denoted by frequency index b. Thick lines in FIG. 2A indicate multiple signals, so that there are multiple outputs, each a frequency band b from analysis filterbank 203. Each of these frequency bands undergoes the processing steps shown in FIG. 2A, up to a synthesis filterbank 223, which sums the bands to a combined wideband signal to generate the modified audio signal 225.

The response of the filter associated with each frequency band in the analysis filterbank 203 is designed to simulate the response at a particular location of the basilar membrane in the inner ear of a human. In some embodiments, analysis filterbank 203 includes a set of linear filters whose bandwidth and spacing are constant on the equivalent rectangular bandwidth (ERB) frequency scale. See FIG. 1.

Analysis filterbank 203 may be implemented efficiently through use of the forward and/or inverse short-time discrete Fourier transform (short-time DFT, STDFT) or the forward and/or inverse modified discrete cosine transform (modified DCT, MDCT). The forward and/or inverse STDFT or MDCT may be used similarly to implement synthesis filterbank 223.

The output of each filter in the analysis filterbank 203 next passes into a transmission filter function or device 205 that is designed to simulate the filtering effect of the transmission of audio through the outer and middle ear of a human.

In order to compute the loudness of the input audio signal, a measure of the audio signals' short-time energy in each filter of the analysis filterbank 203 after application of the transmission filter 205 is obtained. This time and frequency varying measure is referred to as the excitation, denoted E[b,t], where b denotes the frequency band, and t is an index denoting blocks of time. To obtain the excitation, the outputs of transmission filter 205 are accepted by an excitation function or device 207, the outputs of which are designed to simulate the distribution of energy along the basilar membrane of a human ear. Depending on the desired effects, the excitation energy values may be smoothed across time by a smoothing function or device 209 that are configured to have time constants set in accordance with the requirements of the desired effects of the processing. The output of excitation function 207 is a frequency domain representation of energy denoted E in respective ERB bands denoted b per time denoted t.

A specific loudness function or device 211 converts the smoothed excitation signals into specific loudness (SL). Specific loudness may be represented, e.g., in units of sone per unit frequency, e.g., sone per ERB. Note that from the specific loudness, the overall or total loudness is the sum of the specific loudness across all bands b. Designing the specific loudness function 211 includes determining gains for narrowband and wideband estimated values chosen to match experimental data on the growth of loudness for tones and noise. Furthermore, the specific loudness function 211 is designed such that the specific loudness is some small value instead of zero when the excitation is at the threshold of hearing, and such that the specific loudness decreases monotonically to zero as the excitation decreases to zero.

The specific loudness components associated with the frequency bands are passed into a dynamic equalization specific loudness modification function or device 213 that generates a target specific loudness. In the case of perceptual domain dynamic equalization (PDEQ), a target specific loudness may be calculated using a relationship that takes into account the current spectrum of the audio, in particular, the spectrum of the signal is measured and the signal is then dynamically modified in order to transform the measured spectrum closer to an essentially static desired shape, specified across bands b and referred to as EQ[b]. The spectral shape of the audio signal is denoted by L[b,t], and in one embodiment, is determined as a smoothing of the specific loudness, denoted N[b,t] across time. One may not want the PDEQ modification to vary drastically from one band to the next, and therefore a band-smoothing function may be applied to generate a band-smoothed spectrum. In order to preserve the original dynamic range of the audio, the desired spectrum EQ[b] may be normalized to have the same overall loudness as the measured spectral shape given by L[b,t].

In embodiments described herein a target EQ specification function or device 217 is used to provide a control interface to a user in order for the user to specify one or more parameters for the dynamic equalization using one or more respective control elements. The target EQ specifier 217 may include a capture function by which the specific loudness of some audio that has desired properties is captured, e.g., from the specific loudness block 211 while the input 201 is audio with desired characteristics. This provides the desired characteristics EQ[b], which may be stored. In the case there is one EQ[b], the user specified parameter is denoted as $\beta$ in Eqn. 12 and is a parameter that varies from 0 to 1 that expresses the amount of PDEQ that is to be applied, with a value 0 indicating no PDEQ.

Taking as its inputs the smoothed excitation frequency band components from smoother 209 and the target specific loudness from the SL modification 213, a gain solver function or device 215 is configured to determine the gains that needs to be applied to each band b in order to transform the determined specific loudness N[b,t] into the target specific loudness $\hat{N}$[b,t]. The gains determined are in general frequency- and time-varying gains, which, when applied to the original excitation, result in a specific loudness that, ideally, is equal to the desired target specific loudness, and in practice results in modifying the audio signal in order to reduce the difference between its specific loudness and the target specific loudness. The gain solver 215 may be implemented in various ways. If a closed form calculations is possible, it is applied. If a table lookup is possible, such a method also may be used. In one embodiment, the gain solver may include an iterative process in which, for each iteration, a specific loudness is evaluated using a current estimate of the gains. Other methods for computing the modification parameters through either explicit or implicit computation of the specific loudness and target specific loudness may be devised, and this invention is intended to cover all such methods.

The gains per band generated by the gain solver 215 may be smoothed further over time by optional smoothing function or device 219 in order to minimize perceptual artifacts. It may alternately be advantageous that temporal smoothing be applied elsewhere in the overall process or device.

Finally, the gains determined by gain solver 215 are applied to respective bands through a respective multiplicative combining function or combiner 221 that applies the gains to the outputs from the analysis filterbank delayed by a suitable delay function or device 204 configured to compensate for any latency associated with the gain computation.

The modified audio 225 is synthesized from the gain-modified bands in a synthesis filterbank function or device 223. As described above, analysis filterbank 203 may be implemented efficiently through use of the short-time DFT or the modified DCT, and the STDFT or MDCT may be used similarly to implement synthesis filterbank 223. The synthesis filters for the bands are determined from the filters used in analysis filterbank 203 and the delay of delay 204.

Note that alternatively, instead of calculating gains for use in applying gain modifications in frequency bands, the gain solvers 215 may calculate filter coefficients that control a time-varying filter, such as a multi-tapped FIR filter or a multi-pole IIR filter. For simplicity in exposition, aspects of the invention are mainly described as employing gain factors applied to frequency bands, it being understood that filter coefficients and time-varying filters may also be used in practical embodiments.

Approximately Perceptual Dynamic Equalization

While some embodiments of the invention are for perceptual domain dynamic equalization (PDEQ), as described above, aspects of the invention are applicable also to what we call approximate perceptual dynamic equalization, or simply dynamic equalization (DEQ) herein, in which a spectral loudness measure denoted L[b,t] as a function of frequency band and time is an approximation to the specific loudness $L_p$[b,t].

For this approximation, the measure of loudness, also called the signal spectrum, is taken to be $$L[b, t] = \sum_{k=0}^{N-1} |C_b[k]|^2 |X[k, t]|^2, \quad (14)$$

where again $C_b[k]$ are a selected set of bandpass filters that in one embodiment, are chosen to mimic the critical band filtering observed along the basilar membrane in the human ear at critical frequency b, and where X[k,t], k=0, 1, ... N−1, are a set of STDFT (or MDCT) coefficients determined with an overlap window, as is known to those skilled in the art.

Comparing Eqn. 14 to Eqns. 2 and 3, the loudness measure L[b,t] is an approximation of the excitation E[b,t], the approximation being that the filter T[k] representing the frequency response of a filter simulating the transmission of audio through the outer and inner ear of a human has constant magnitude for all k. Furthermore, the loudness spectral measure L[b,t] can be considered an approximation to the specific loudness with the function $\Psi\{\cdot\}$ being the identity function such that $\Psi\{L[b,t]\}$=L[b,t]. Hence performing DEQ with such a loudness measure can be considered approximately perceptual DEQ.

For approximately perceptual DEQ, a set of time varying multi-band gains G[b,t] forming a time varying filter according to the relationship is applied according to the relationship:

$$\hat{L}[b,t] = G^2[b,t] L[b,t]. \quad (15)$$

is applied to the original signal spectrum L[b,t], resulting in a transformed spectral loudness measure denoted $\hat{L}$[b,t] whose spectral shape is closer to the desired shape denoted, as before, by EQ[b]. Eqn. 15 is analogous to Eqn. 9, the latter being for PDEQ.

In some embodiments, for DEQ, the filter gains G[b,t] are computed by comparing the spectral shape of the original signal L[b,t] to the desired shape EQ[b]. To prevent the filter G[b,t] from varying too fast over time and causing artifacts in the processed audio, the signal spectrum, i.e., the approximate loudness measure L[b,t] may first be smoothed across time in each band b using a smoothing coefficient denoted λ:

$$\bar{L}[b,t] = \lambda \bar{L}[b,t-1] + (1-\lambda) L[b,t]. \quad (16)$$

In alternate embodiments, different smoothing methods may be used.

As in the case, of PDEQ, for DEQ, to preserve the original dynamic range of the audio signal, the desired spectral shape EQ[b] may be normalized to have the same overall level as the smoothed signal spectrum $\bar{L}$[b,t]:

$$EQ_{NORM}[b, t] = \left( \frac{\sum_c \bar{L}[c, t]}{\sum_c EQ[c]} \right) EQ[b] \quad (17)$$

The filter $G^2$[b,t] is computed from the ratio of the normalized spectral shape $EQ_{NORM}$[b,t] and the smoothed signal spectrum $\bar{L}$[b,t]:

$$G^2[b, t] = \left( \frac{\bar{L}[b, t]}{EQ_{NORM}[b, t]} \right)^{1-\beta} \frac{EQ_{NORM}[b, t]}{\bar{L}[b, t]}, \quad (18)$$

where β is a user-specified parameter ranging from zero to one, indicating the degree of DEQ processing that is to be applied to the audio. Analyzing Eqn. 18, one notes that when β=0, the filter G[b,t] equals one for all bands b and therefore the original signal is unmodified. When β=1, the filter is equal to the ratio of the normalized desired shape to the smoothed signal spectrum, thereby transforming the smoothed spectral shape of the original audio completely to that of the desired shape EQ[b].

Figure 2B:
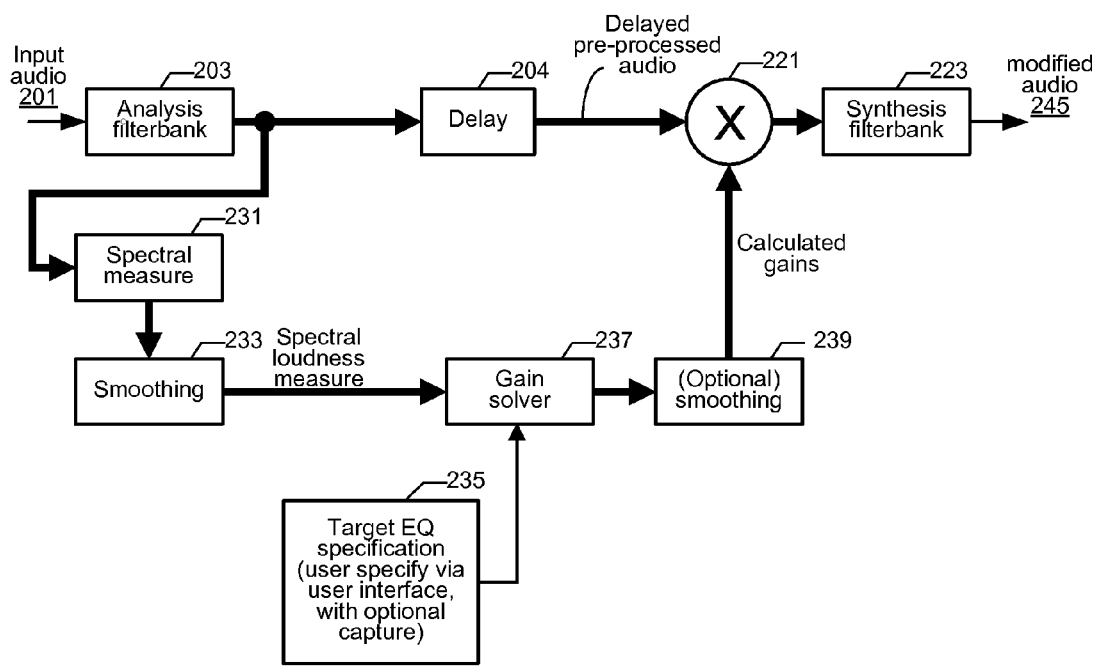
FIG. 2B shows a simplified block diagram of a feed-forward embodiment of a dynamic equalization signal processing apparatus.

FIG. 2B shows a simplified block diagram of a feed-forward embodiment of a DEQ apparatus in which pre-processing separates an input audio signal into frequency bands. In practical embodiments, the processing of the audio is carried out in the digital domain, so that sampling and digitizing of analog signals is carried out. Such details are left out of this description, and would be clear to those skilled in the art.

As in the case of FIG. 2A, the apparatus of FIG. 2B may be included, for example, in a media device or some other audio device for playing back audio. An apparatus that processes audio signals, such as a media device, is called an audio signal processing apparatus herein.

The arrangement shown in FIG. 2B is used to carry out DEQ as described above, e.g., in Eqns. 14 through 18, with the addition of a control interface including a control interface with one or more control elements configured to accept a user input for specifying the equalization, as described in more detail herein below.

The Audio 201 first passes through an analysis filterbank function or device 203, which splits the audio signal into a plurality of frequency bands denoted by frequency index b. Thick lines in FIG. 2B indicate multiple signals, so that there are multiple outputs, each a frequency band b from analysis filterbank 203. Each of these frequency bands undergoes the processing steps shown in FIG. 2B, up to a synthesis filterbank 223, which sums the bands to a combined wideband signal to generate the modified audio signal 225. Analysis filterbank 203 and synthesis filterbank 223 in FIG. 2B can be substantially as in FIG. 2A.

The output of each filter in the analysis filterbank 203 is used to determine in spectral measure determiner 231 the spectral measure of loudness, denoted L[b,t], where b denotes the frequency band, and t is an index denoting blocks of time. The spectral measure determiner 231 is in one embodiment substantially the same as element 207 of FIG. 2A. Depending on the desired effects, the spectral measure L[b,t] energy values may be smoothed across time by a smoothing function or device 233 that is configured to have time constants set in accordance with the requirements of the desired effects of the processing.

The smoother loudness measure from smoothing device 233 and an essentially static desired spectral shape, specified across bands b and referred to as EQ[b] and used to generate a set of gains by a gain solver 237 as described in above in Eqns. (17) and (18).

In embodiments described herein a target EQ specification function or device 235 is used to provide a control interface to a user in order for the user to specify one or more parameters for the dynamic equalization using one or more respective control elements. The target EQ specifier 235 may include a capture function by which the spectral content L of some audio that has desired properties is captured, e.g., from the spectral measure block 231 or smoothing block 233 while the input 201 is audio with desired characteristics. This provides the desired characteristics EQ[b], which may be stored. In the case there is one EQ[b], the user specified parameter is denoted β as in Eqn. 18 and is a parameter that varies from 0 to 1 that expresses the amount of DEQ that is to be applied, with a value 0 indicating no DEQ.

The gains determined are in general frequency- and time-varying gains, which, when applied to the spectral measure, result in a spectral measure that, ideally, is equal to the desired target spectral measure EQ[b], and in practice results in modifying the audio signal in order to reduce the difference between the spectral measure of the signal and the target spectral measure EQ[b]. The gain solver 237 may be implemented in various ways.

The gains per band generated by the gain solver 237 may be smoothed further over time by optional smoothing function or device 239 in order to minimize perceptual artifacts. It may alternately be advantageous that temporal smoothing be applied elsewhere in the overall process or device.

Finally, the gains determined by gain solver 237 are applied to respective bands through a respective multiplicative combining function or combiner 221 that applies the gains to the outputs from the analysis filterbank delayed by a suitable delay function or device 204 configured to compensate for any latency associated with the gain computation.

The modified audio 225 is synthesized from the gain-modified bands in a synthesis filterbank function or device 223. The synthesis filters for the bands are determined from the filters used in analysis filterbank 203 and the delay of delay 204, and otherwise are as described with reference to FIG. 2A.

Note that alternatively, instead of calculating gains for use in applying gain modifications in frequency bands, the gain solvers 237 may calculate filter coefficients that control a time-varying filter, such as a multi-tapped FIR filter or a multi-pole IIR filter. For simplicity in exposition, aspects of the invention are mainly described as employing gain factors applied to frequency bands, it being understood that filter coefficients and time-varying filters may also be used in practical embodiments.

An Apparatus with a Processing System

Figure 3:
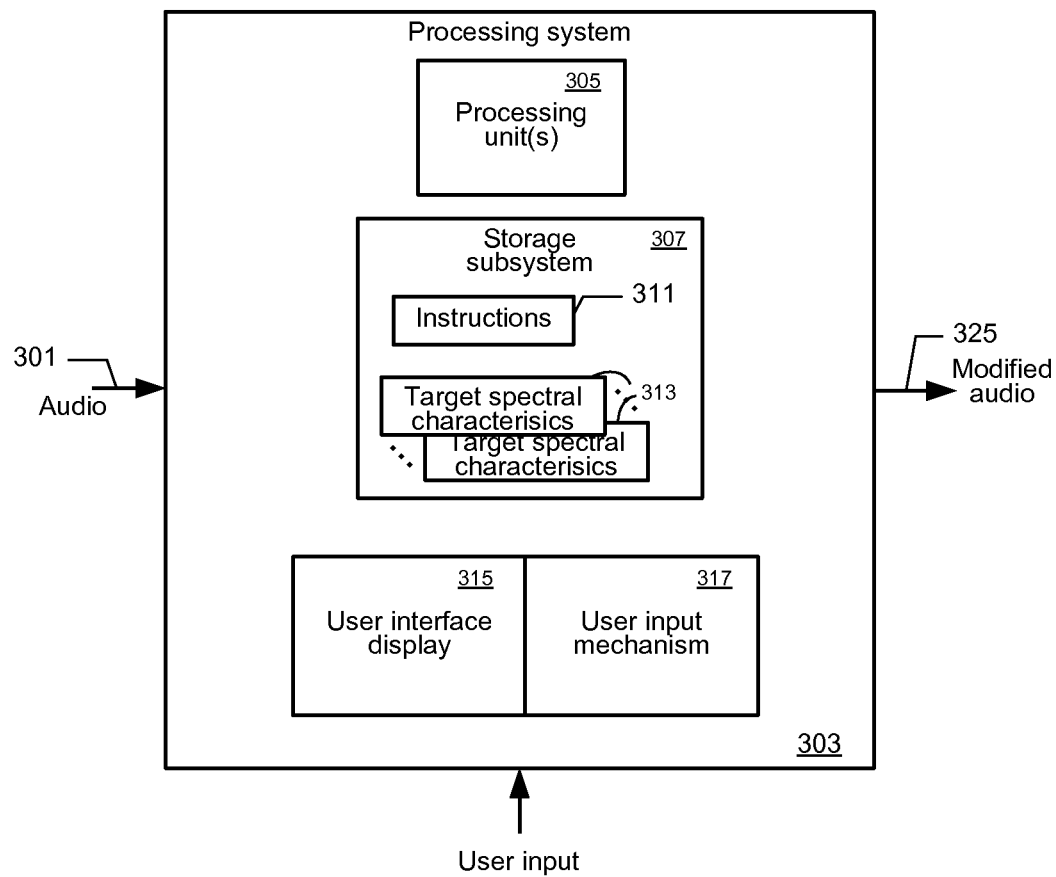
FIG. 3 shows a simplified block diagram of an apparatus embodiment for processing audio by perceptual domain or not necessarily perceptual domain dynamic equalization as specified in accordance to one or more features of the present invention.

FIG. 3 shows a simplified block diagram of one apparatus embodiment for processing audio 201 to generate audio output 325 that has been modified by DEQ or PDEQ as specified in accordance to one or more features of the present invention. The apparatus, for example, can implement PDEQ processing such as described by Eqns. 1 to 134, or DEQ processing such as described by Eqns. 14 to 18. Such an apparatus may be included, for example, in a media device for playback of audio media. The audio input 201 and the audio output 325 are assumed to be in the form of sampled data. In the case of analog input, a digitizer including an analog to digital converter and quantizer would be present. For audio playback, a de-quantizer and a digital-to-analog converter would be present. Such and other elements that might be included in a complete audio processing system, e.g., media device are left out, and how to include such elements would be clear to one skilled in the art. The embodiment shown in FIG. 3 includes a processing system 303 that is configured in operation to carry out the PDEQ or DEQ methods described herein, including specifying the desired equalization via one or more of the control interface embodiments described herein. The processing system 303 includes at least one processing units (processors) 305, which can be the processing units of a digital signal processing device, or a CPU of a more general purpose processing device. The processing system 303 also includes a storage subsystem 307 typically including one or more memory elements. In one embodiment, the processing system 303 further includes a control interface that includes a user interface display 315 for displaying a user interface to a user, and at least one control element 317 configured to accept a user input and coupled to the user interface display. The elements of the processing system are coupled, e.g., by a bus subsystem or some other interconnection mechanism not shown in FIG. 3. Some of the elements of processing system 303 may be integrated into a single circuit, using techniques common skilled in the art.

The storage subsystem 307 includes instructions 311 that when executed by the processing unit or units 305, cause carrying out of the methods described herein.

In some embodiments, the storage subsystem 307 is configured to store one or more target spectral characteristics 313 used, in conjunction with the control elements, to accept user input to specify the DEQ or PDEQ processing carried out by the processing system 303.

The system shown in FIG. 3 can be incorporated in a specialized device such as a portable media player. The system also can be part of a general purpose computer, e.g., a personal computer configured to process audio signals.

Interacting with a DEQ Processing System or Device

In the remainder of this description, by dynamic equalization is meant either perceptual domain dynamic equalization (PDEQ), or the broader not necessarily perceptual domain perceptual dynamic equalization (DEQ) in which the time varying spectrum of an input signal is modified to more closely resemble a time invariant spectral profile, called a "DEQ preset spectral profile" and denoted EQ[b] herein, for both the cases of perceptual DEQ processing and other DEQ processing. In general, the term DEQ processing will be understood to mean either perceptual DEQ, e.g., per Eqns. 1 to 13, or DEQ which is not necessarily purely perceptual, e.g., per Eqns. 14 to 18.

A Single Selected DEQ Preset Spectral Profile

One feature of embodiments of the present invention includes a method and apparatus for a user to interact with a DEQ processing system or device. Such interactions including presenting a control interface to a user, and accepting settings by the user of control elements in the control interface. For example, the system shown in FIG. 3 includes a graphical user interface 315 for presenting controls, and at least one control element configured to accept a user input. Alternate embodiments for the control interface can include traditional components such as knobs, sliders, and so forth.

Figures 4A, 4B:
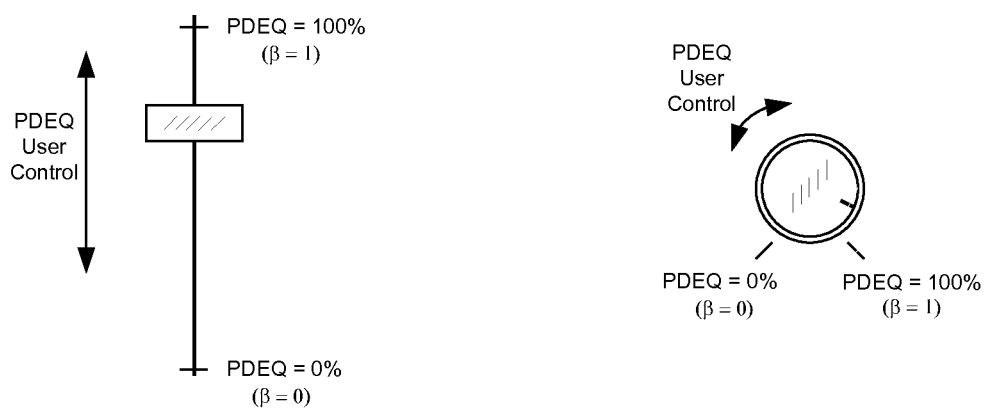
FIG. 4A shows a basic slider control interface for dynamic equalization on a media device according to some embodiments of the present invention.
FIG. 4B shows a basic knob control interface for dynamic equalization on a media device according to some embodiments of the present invention.

In one set of embodiments, the existence of a DEQ preset spectral profile EQ[b] and the variable degree of DEQ processing $\beta$ provides a simple parameter that allows a user of a media device such as implemented in FIG. 3 unprecedented control over the perceived spectrum of an audio signal. FIGS. 4A and 4B each shows a control interface—a slider in FIG. 4A, and a rotary knob in FIG. 4B—for controlling the amount of DEQ processing according to a DEQ preset spectral profile EQ[b]. The DEQ preset spectral profile EQ[b] stored, e.g., as one of a set of stored DEQ preset spectral profiles. The user selected a particular DEQ preset spectral profile EQ[b] and selects the amount of DEQ to apply according to the position of the DEQ controller. The slider or knob position is accepted and, in some embodiments, perceptual DEQ processing is applied to an audio signal according to Eqns. 8, 12, and 13, or in other embodiments, DEQ processing according to Eqns. 17 and 18. That is, for the case of perceptual DEQ, the preset specific loudness and the gains are determined according to Eqns. 8, 12 and 13. The audio is processed according to the determined multi-band gains.

In FIG. 4A the DEQ controller is a standard slider which controls the amount of DEQ applied, where DEQ=0% corresponds to $\beta=0$ and DEQ=100% corresponds to $\beta=1$. Similarly, the same user control could be provided through the use of a standard rotary controller (knob) as shown in FIG. 4B. In the application shown in FIGS. 4A and 4B, when DEQ is set to 0%, no processing of the audio signal takes place and as the amount of DEQ applied is increased to 100%, the full spectral processing is applied to the input audio signal.

Note than when implemented on a processing system such as shown in FIG. 3, the DEQ control interface of FIGS. 4A, 4B include a virtual slider (FIG. 4A) or a virtual knob (FIG. 4B) rendered on a graphical user interface display 315. Thus, the control elements include one or more virtual or actual slider controls or one or more virtual or actual rotary controls.

Multiple Preset Spectral Profiles

As described above, some embodiments of the DEQ processing system include the ability to store a plurality of preset spectral profiles. Each of these may be recalled by a user. These DEQ preset spectral profiles may be preconfigured, e.g., by a manufacturer. Some embodiments also include the ability for a spectral profile to be captured by a user using a DEQ equalization profile capture function in the target EQ specifier 217 (see, e.g., FIG. 2). Such capture includes capturing the output of specific loudness block 211 when the input 201 is audio that has desired properties.

Thus, in some embodiments, the control interface includes at least one control element for selecting one or more DEQ preset spectral profiles from a set of DEQ preset spectral profiles.

The existence of multiple DEQ preset spectral profiles stored in a system allows additional manipulation and control of the perceived spectrum of an audio signal. A relatively unsophisticated user can achieve relatively sophisticated equalization.

Control Between a Pair of Preset Spectral Profiles

FIGS. 5A and 5B each shows a control interface—a simple slider control in FIG. 5A and a simple knob control in FIG. 5B—that is manipulated by a user to select DEQ between two DEQ preset spectral profiles denoted $EQ_1[b]$ and $EQ_2[b]$. In some embodiments, the control interface includes at least one control element for selecting two preset spectral profiles, and a control element (the slider or knob) for setting a parameter we call the preset morphing parameter (also called the preset blending parameter) in order to determine a blending of the two DEQ preset spectral profiles for the audio output. The selecting of the two DEQ preset spectral profiles is from a set of DEQ preset spectral profiles, e.g., stored, pre-defined DEQ preset spectral profiles that were selected in the factory by the manufacturer, or DEQ preset spectral profiles that were obtained by capture, or otherwise. The two DEQ preset spectral profiles $EQ_1[b]$ and $EQ_2[b]$ are used as the limits on either end of the DEQ controller. The slider or knob sets the preset morphing parameter, denoted $\alpha$, $0 \leq \alpha \leq 1$, such that the EQ[b] applied in some perceptual DEQ processing embodiments according to Eqns. 8, 12, and 13, or in other DEQ processing embodiments, according to Eqns. 17 and 18, is a linear combination of the two DEQ preset spectral profiles determined by the parameter $\alpha$.

$$EQ[b]=\alpha \cdot EQ_2[b]+(1-\alpha) \cdot EQ_1[b] \tag{19}$$

In one embodiment, the parameter $\beta$ in Eqn. 12 or Eqn. 18 is set to a fixed value of 1. In an alternate embodiment, an additional control interface, e.g., an additional slider or knob is provided to the user to select the parameter $\beta$.

As shown in FIGS. 5A and 5B, when the slider is set to the bottom position, or $\alpha=0$ then the audio signal is fully processed using DEQ preset spectral profile $EQ_1[b]$. As the slider is moved and the value of $\alpha$ increased, the applied DEQ preset spectral profile applied is a combination of the two DEQ preset spectral profiles $EQ_1[b]$ and $EQ_2[b]$ until the value of $\alpha$ is increased to its full value of 1 when the DEQ preset spectral profile applied is fully $EQ_2[b]$.

One embodiment includes selecting the preset spectral profiles such that $EQ_1[b]$ is designed to boost bass frequencies and $EQ_2[b]$ is designed to boost treble frequencies. With such an embodiment, the control interface provides a content aware version of what is commonly called a tone control. Another embodiment includes selecting $EQ_1[b]$ designed to reduce the response to bass and treble frequencies, i.e., to provide a bass and treble cut, and selecting $EQ_2[b]$ to increase the response to bass and treble frequencies, i.e., to provide a bass and treble boost such that the control interface provides what is commonly called a loudness control in traditional audio systems, but carried out in a audio signal content aware manner. Of course, in some embodiments, two controls are included, one providing content aware tone control, and the other providing content aware loudness control.

While Eqn. 19 shows linear morphing between two DEQ preset spectral profiles denoted according to a linear transformation, the invention is not limited to such morphing by linear transformation. Alternate embodiments include morphing according to a different, e.g., non-linear transformation such as a logarithmic transformation. In yet another embodiment, a look-up table rather than a calculation is used to determine EQ[b].

In some embodiments, the control interface includes an additional control element configured to control the amount of DEQ processing to apply using the blended two DEQ preset spectral profiles of Eqn. 19.

Control Between More than Two Preset Spectral Profiles

Figures 6A, 6B:
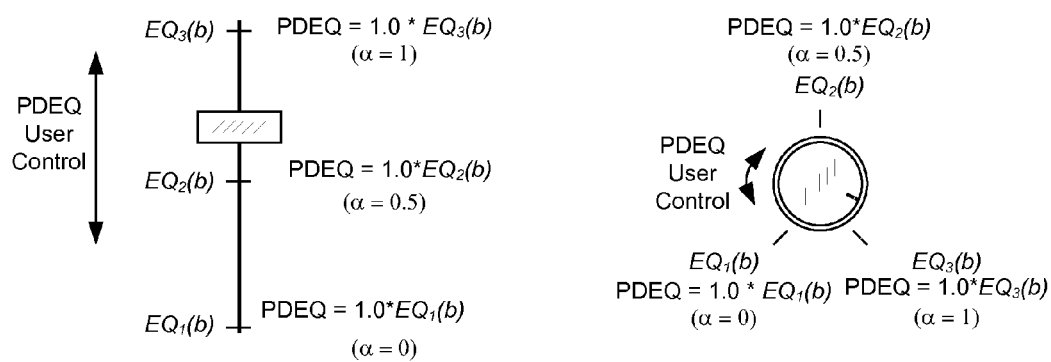
FIGS. 6A and 6B show a slider control interface and a knob control interface, respectively, each providing a user control of the application of three different dynamic equalization preset spectral profiles on a media device according to some embodiments of the present invention.

The control interface for DEQ processing shown in FIGS. 5A and 5B can easily be expanded to include the control and application of more than two DEQ preset spectral profiles. FIGS. 6A and 6B each shows a control interface that addresses the application and control of three different DEQ preset spectral profiles—using a slider in the case of FIG. 6A, and a knob in FIG. 6B.

In this usage scenario, a user selects three or more DEQ preset spectral profiles, e.g., three DEQ preset spectral profiles denoted $EQ_1[b]$, $EQ_2[b]$, and $EQ_3[b]$ from a set of DEQ preset spectral profiles that may be factory defined. The control allows a user to determine a DEQ preset spectral profile that morphs between pairs of the three or more selected DEQ preset spectral profiles. The three or more selected DEQ preset spectral profiles are spatially distributed on different positions on the control elements, e.g., slider or knob of the control interface that are configured to accept user input via respective input mechanism(s). The user adjusts the control element to select a blending of a pair of DEQ preset spectral profiles according to the preset blending parameter (also called morphing parameter) denoted $\alpha$, defined in the case of three selected DEQ preset spectral profiles such that the EQ[b] applied in some perceptual DEQ processing embodiments according to Eqns. 8, 12, and 13, or in other DEQ processing embodiments, according to Eqns. 17 and 18 is set equal to:

$$EQ[b]=2\alpha \cdot EQ_2[b]+(1-2\alpha) \cdot EQ_1[b] \text{ for } 0 \leq \alpha \leq 0.5 \quad (20)$$

and $$EQ[b]=2(\alpha-0.5) \cdot EQ_3[b]+(1-2(\alpha-0.5)) \cdot EQ_2[b] \text{ for } 0.5 < \alpha \leq 1.0 \quad (21)$$

In some embodiments, the parameter $\beta$ (as used in Eqn. 12 or Eqn. 18) is set to a fixed value of 1 for full effect. In alternate embodiments, the control interface further includes a control element for controlling the amount of the overall DEQ processing that is applied, e.g., by an additional control interface, e.g., an additional slider or knob is provided to the user to select the parameter $\beta$. Thus, the value of $\beta$ does not need to be fixed at 1, or the same value all the time. The value of $\beta$ could alter as the selected preset changes. The value of $\beta$ could also be altered based on the genre of music being played or date of production of a music track being played.

It should be reiterated, that instead of a user selecting multiple individual DEQ preset spectral profiles, multiple DEQ preset spectral profiles could be grouped by an audio device manufacturer into meta-DEQ preset spectral profiles to make it easier for the user to interact with the audio device. A user could also create one or more user's own custom meta-DEQ preset spectral profiles by manually selecting multiple DEQ preset spectral profiles.

The order of the DEQ preset spectral profiles from $\alpha=0$ to $\alpha=1$ may be determined by a perceptual analysis and ordering of the DEQ preset spectral profiles. For example in FIGS. 6A and 6B, $EQ_1[b]$ could be chosen to be a preset that boosts only low frequencies, $EQ_2[b]$ could be chosen to be a preset that boosts predominantly middle frequencies and $EQ_3[b]$ could be chosen to be a preset that boosts only high frequencies. In this manner, the one control element can be used to provide an input content aware tone control.

While Eqns. 20 and 21 show linear morphing between pairs of DEQ preset spectral profiles according to a linear transformation, the invention is not limited to such morphing by linear transformation. Alternate embodiments include morphing according to a different, e.g., non-linear transformation such as a logarithmic transformation. In yet another embodiment, a look-up table rather than a calculation is used to determine EQ[b].

The use of multiple DEQ preset spectral profiles can easily be expanded to more than the three outlined in FIGS. 6A and 6B with their distribution on the $\alpha$ parameter controller being something other than equally distributed.

DEQ Control Interface Using a Two-Dimensional Control Element

Further embodiments of the invention include a control interface that includes a two dimensional control element configured to accept a user indication of a location on an area defining the two-dimensional control element. Examples of a control interface with a two dimensional control element include a touchpad used to control the cursor found on most computer laptops, a trackball in combination with a displayed two dimensional surface, and a displayed two dimensional surface in a touch sensitive screen. Such control interfaces with two dimensional control elements recently also appear in devices such as cellular telephones and portable media devices.

The two-dimensional surface of the two-dimensional control element is called the control surface herein.

Figure 7:
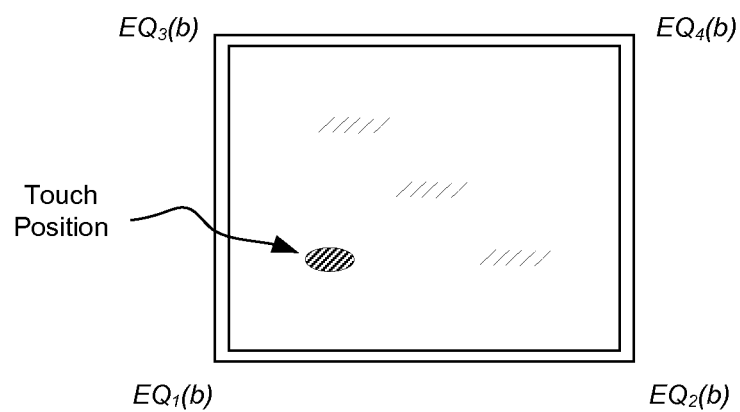
FIG. 7 shows a control interface with a two dimensional user control element of a control interface for control of the application of four dynamic equalization preset spectral profiles according to some embodiments of the present invention.

A two-dimensional control element allows additional powerful control of DEQ preset spectral profiles compared to the one-dimensional control elements described above and in FIGS. 5A though 6B. FIG. 7 shows a two-dimensional control element, such as a computer touchpad or media device touch sensitive screen, that provides for a user a mechanism to control the type of DEQ applied to an audio signal. An example scenario includes a user selecting four DEQ preset spectral profiles from a set of DEQ preset spectral profiles, or the user selecting a pre-defined set that when selected defines four individual DEQ preset spectral profiles. In the case of a rectangle-shaped two-dimensional control element, the control element is configured such that each corner corresponds to one of the four individual DEQ preset spectral profiles.

The control interface is then used to specify the preset EQ[b] that is applied in Eqns. 12—or Eqn, 18 depending on the type of DEQ processing. In some embodiments, bilinear interpolation and the X-Y coordinates of the user specified position are used to interpolate between the four DEQ preset spectral profiles located at the four corners of the two-dimensional control element.

Figure 8:
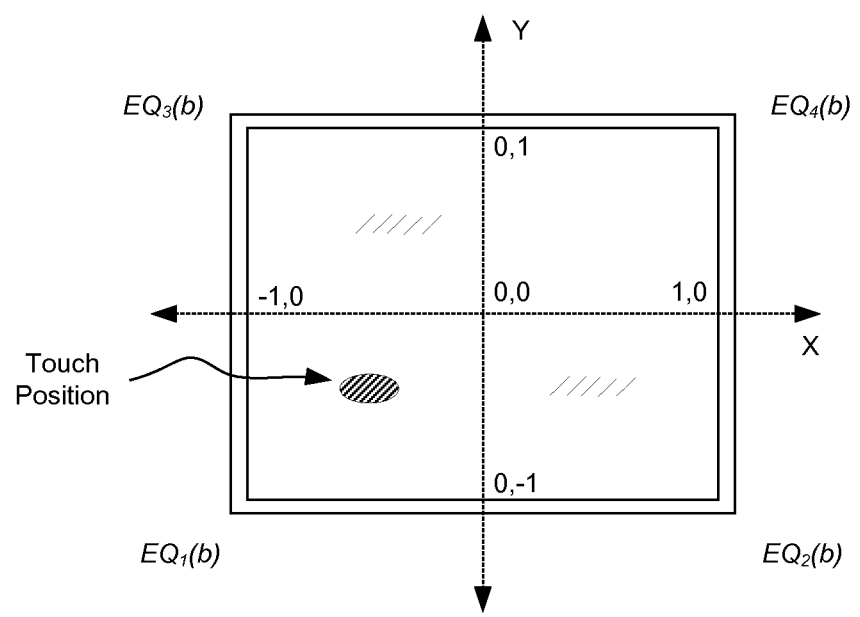
FIG. 8 shows the two-dimensional control element of FIG. 7 with overlaid coordinate axes that are used to translate the user input position to parameters that are used to compute the equalization spectral profile for dynamic equalization according to some embodiments of the present invention.

FIG. 8 shows the two-dimensional control element of FIG. 7 with overlaid X-Y coordinate axes that are used to translate the user input position to X-Y values that are used to compute EQ[b].

Denote by $EQ_1[b]$, $EQ_2[b]$, $EQ_3[b]$, and $EQ_4[b]$ the four DEQ preset spectral profiles of the corners. Then, for the example as shown in FIG. 8:

$$EQ[b]=0.25 \cdot EQ_1[b]+0.25 \cdot EQ_2[b]+0.25 \cdot EQ_3[b]+ 0.25 \cdot EQ_4[b] \text{ for } X,Y=0,0 \quad (22)$$

and similarly $$EQ[b]=EQ_1[b] \text{ for } X,Y=-1,-1 \quad (23)$$

$$EQ[b]=EQ_2[b] \text{ for } X,Y=1,-1 \quad (24)$$

and so on.

The EQ[b] for other X,Y values is the combination obtained by fitting a bilinear surface through existing data points. The value of an interpolated point is a combination of the values of the four closest points $EQ_1[b]$, $EQ_2[b]$, $EQ_3[b]$, and $EQ_4[b]$.

Alternate embodiments use other processes to compute EQ[b] from the user-indicated X,Y position and the four individual DEQ preset spectral profiles. One alternate embodiment using bi-triangular linear interpolation divides the rectangular area into a pair of triangles, then interpolates linearly within the corresponding triangle. Yet other embodiments use nonlinear combinations. One example of use of a nonlinear combination is to provide finer control in the canter region of the control surface.

Figure 9:
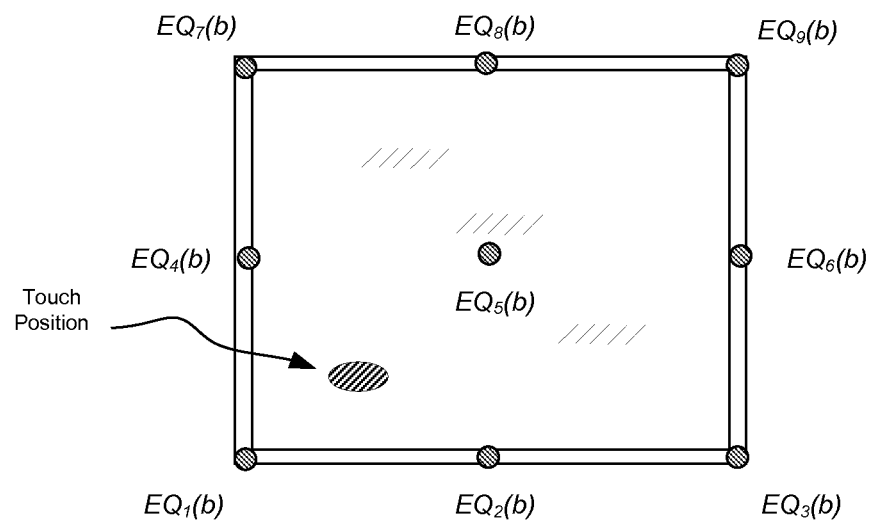
FIG. 9 shows a two-dimensional control element of a control interface for user control of the application of nine dynamic equalization preset spectral profiles according to some embodiments of the present invention.

A two-dimensional control element can be used for control of the application of more than four DEQ preset spectral profiles. FIG. 9 illustrates a control interface with a two-dimensional control element that provides control between nine DEQ preset spectral profiles denoted $EQ_1[b]$, $EQ_2[b]$, $EQ_3[b]$, $EQ_4[b]$, $EQ_5[b]$, $EQ_6[b]$, $EQ_7[b]$, $EQ_8[b]$, and $EQ_9[b]$. Such control can of course be expanded to a larger number of DEQ preset spectral profiles used in conjunction with the control interface. As for a one-dimensional controller, the ordering of the DEQ preset spectral profiles, in this case on the two-dimensional control element, can be determined by a perceptual analysis and ordering of the DEQ preset spectral profiles, e.g., by the manufacturer for factory provided DEQ preset spectral profiles, or by the media device to include user defined DEQ preset spectral profiles.

As for the case of one-dimensional control elements, for two-dimensional control elements, the parameter β in Eqn. 12—or Eqn. 18, depending on the type of DEQ processing—can be set to a fixed value of 1 for full effect or it may be controlled via an additional control interface.

In one embodiment, a pressure sensitive two-dimensional touch sensitive control element is used that provides a two dimensional location and a third parameter according to the pressure applied. The parameter β that determines how much of the DEQ to apply, e.g., according to Eqns. 8, 12 and 13, or Eqns. 17 and 18 depending of the type of DEQ processing, is set by a user by the pressure the user applies.

It should be noted that the morphing between the DEQ preset spectral profiles could also use a different, non-linear transformation such as a logarithmic transformation, than the simple ones specified in Eqns. 22 through 24.

Note: DEQ Control Elements Having More than Two Dimensions

While this disclosure provides examples of one and two-dimensional control of a DEQ system, alternate embodiments use control element having more than two dimensions, for example a virtual three-dimensional controller rendered in a computer environment or a controller that is aware of its X, Y and Z position and that can be controlled in three-dimensional space by a user. Examples of three-dimensional control elements include a gyroscopic mouse, and a gaming glove. Such and other three-dimensional control elements are known skilled in the art and may be used as the control element in different control interface embodiments of the present invention.

Integration of DEQ with Standard Bass and Treble Controls

Many media devices include standard bass and treble controls. Some embodiments of the invention have a control interface that includes control elements that control bass response and treble response analogous to standard bass and treble controls as found on many media devices, but applying a DEQ preset spectral profile EQ[b] defined by two parameters that define the amount of DEQ in a lower range and an upper range of frequency bands b.

Figure 10A:
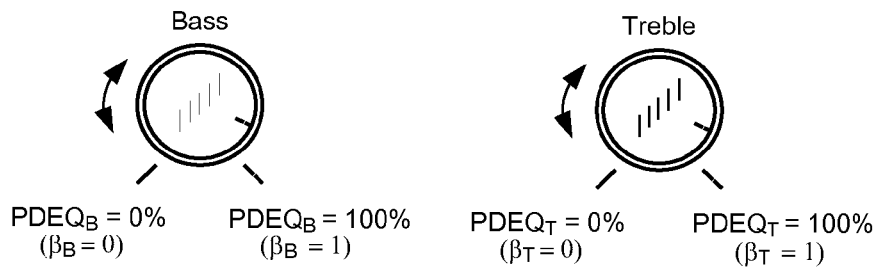
FIG. 10A shows an example control interface with an input control mechanism that includes a rotary bass control and a rotary treble control according to some embodiments of the present invention.
Figure 10B:
FIG. 10B shows the overall desired spectral shape for dynamic equalization using the control of FIG. 10A.

FIG. 10A show a control interface with an input control mechanism that includes a rotary bass control and a rotary treble control. Other embodiments may use slider controls. In some embodiments, these are mechanical controls included in a media device, while in other embodiments, these are virtual controls. In conventional audio equipment, such controls control the parameters of a standard bass control and treble control shelving filter. In embodiments of the present invention, the control interface is to control the amount of DEQ applied in two frequency bands—a bass band and a treble frequency band. Rather than a single DEQ control controlling in one embodiment, these are non-overlapping ranges of frequency band indices b. The bass and treble control vary two frequency dependent DEQ parameters denoted $β_B$ and $β_T$ that control a first lower frequency band and a second higher frequency band, the bands defined by a crossover frequency denoted $B_x$ and a high cutoff frequency denoted $B_{max}$, such that the bands for b are $0 ≤ b < B_x$ for the bass and $B_x ≤ b < B_{max}$ for the treble. The processing to modify the specific loudness, rather than defined by Eqns. 11 and 12 in the case of perceptual DEQ are defined by:

$$\hat{N}[b, t] = \left(\frac{\overline{L}_p[b, t]}{EQ_{NORM}[b, t]}\right)^{1-β_B} \frac{EQ_{NORM}[b, t]}{\overline{L}_p[b, t]} N[b, t], \quad (25)$$

for $0 ≤ b < B_x$ and $$\hat{N}[b, t] = \left(\frac{\overline{L}_p[b, t]}{EQ_{NORM}[b, t]}\right)^{1-β_T} \frac{EQ_{NORM}[b, t]}{\overline{L}_p[b, t]} N[b, t], \quad (26)$$

for $B_x ≤ b < B_{max}$.

where the desired spectral shape is defined by EQ[b] as shown, for example, in FIG. 10B, and $EQ_{NORM}[b,t]$ is the normalized spectral shape defined to have the same overall level as the smoothed signal loudness denoted $\overline{L}_p[b,t]$.

For the case of the DEQ processing of Eqns. 14 to 18, for the treble, processing to modify the spectral property, rather than defined by Eqns. 15 and 18 are defined by:

$$\hat{L}[b, t] = \left(\frac{\overline{L}[b, t]}{EQ_{NORM}[b, t]}\right)^{1-β_B} \frac{EQ_{NORM}[b, t]}{\overline{L}[b, t]} L[b, t], \quad (25)$$

for $0 ≤ b < B_x$ and $$\hat{L}[b, t] = \left(\frac{\overline{L}[b, t]}{EQ_{NORM}[b, t]}\right)^{1-β_T} \frac{EQ_{NORM}[b, t]}{\overline{L}[b, t]} L[b, t], \quad (26)$$

for $B_x ≤ b < B_{max}$.

where the desired spectral shape is defined by EQ[b] as shown, for example, in FIG. 10B, and $EQ_{NORM}[b,t]$ is the normalized spectral shape defined to have the same overall level as the smoothed signal spectral content denoted $\overline{L}[b,t]$.

FIG. 10A shows the two parameters $β_B$ and $β_T$ annotated on the interface as percentage parameters $DEQ_B$ and $DEQ_T$, respectively. Thus, referring to FIG. 10A, bass control $DEQ_B=0\%$ corresponds to $β_B=0$ and $DEQ_B=100\%$ corresponds to $β_B=1$. Similarly, treble control $DEQ_T=0\%$ corresponds to $β_T=0$ and $DEQ_T=100\%$ corresponds to $β_T=1$.

Figure 10C:
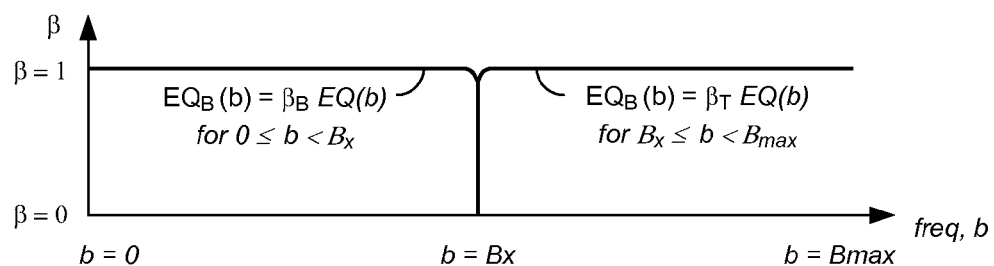
FIG. 10C shows how the frequency ranges that the bass and treble input control mechanisms vary in this example.

FIG. 10C shows the frequency ranges for how the overall parameter β of Eqn. 18 is made up of components $β_B$ and $β_T$ in the bass and treble frequency band ranges that make up all frequency bands.

When both $DEQ_B$ and $DEQ_T$ are set to 0%, no alteration of the audio signal takes place. As the bass control is manipulated and the amount of $DEQ_B$ applied is increased to 100%, spectral processing of the input audio signal according to the preset EQ[b] is carried out (only) in the lower bass frequency range for $0 ≤ b < B_x$. Similarly, as the treble control is manipulated and the amount of $DEQ_T$ applied is increased to 100%, spectral processing of the input audio signal according to the preset EQ[b] is carried out (only) in the higher treble frequency range of $B_x \leq b < B_{max}$. It should be noted that by changing the parameters $DEQ_B$ or $DEQ_T$ from 0% to 100%, this can introduce either a cut or boost in the audio signal depending on the characteristics of the audio signal and the desired spectral shape selected by the user.

Integration of DEQ with Multi-Band Equalizer Controls

Using frequency dependent controls to determine how a DEQ preset spectral profile is applied can be expanded beyond two frequency bands, e.g., a bass and a treble control to three separate controls. e.g., bass, mid-range and treble controls, and also to multiple frequency bands using a control interface that mimics a graphic equalizer control interface. In some embodiments, the control interface includes a plurality of control elements that each defines the amount of DEQ to apply according to a single DEQ preset spectral profile in a respective one of a corresponding plurality of contiguous frequency bands of the single DEQ preset spectral profile to provide multi-band equalizer controls.

Figure 11A:
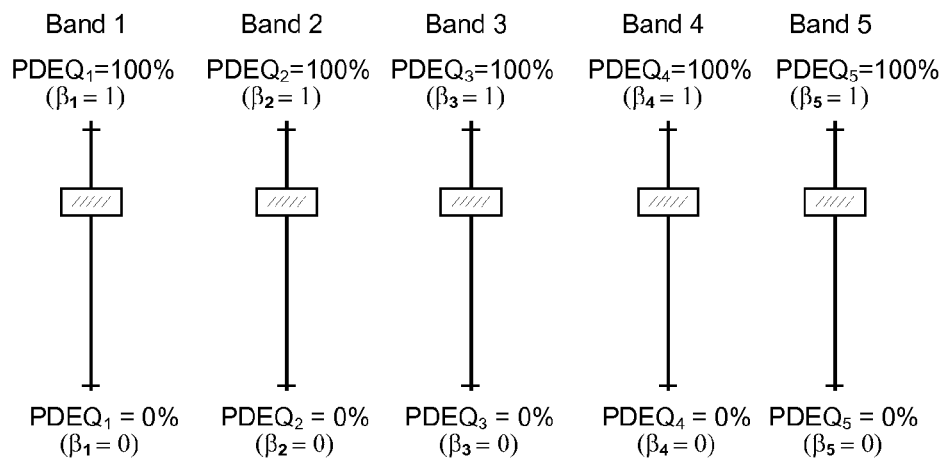
FIG. 11A show an example control interface with an input control mechanism that includes slider controls for multiple frequency bands analogous to a multi-band equalizer according to some embodiments of the present invention.
Figure 11B:
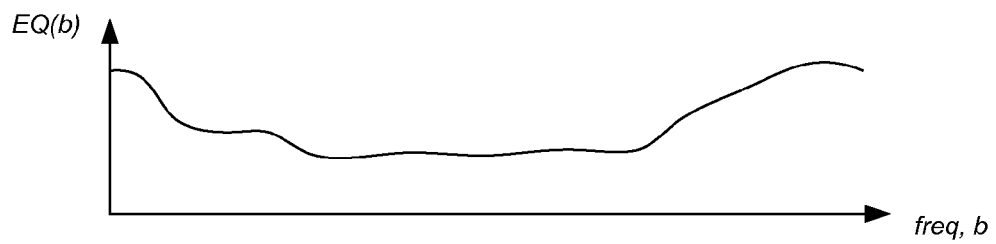
FIG. 11B shows the overall desired spectral shape for dynamic equalization using multiple input controls of FIG. 11A.
Figure 11C:
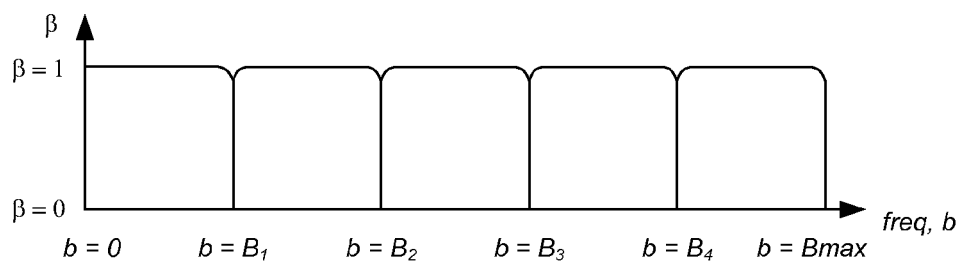
FIG. 11C shows how the overall frequency range is divided into ranges that the respective slider controls of FIG. 11A vary in this example.

FIG. 11A shows a control interface that shows slider controls for a set of frequency bands denoted Band 1, Band 2, ..., Band 5, respectively. FIG. 11B shows the desired spectral shape EQ[b], while FIG. 11C shows how the full frequency range of b is divided into five bands defined by a set of four cross-over frequencies denoted $B_1$, $B_2$, $B_3$, and $B_4$, and a maximum frequency denoted $\beta_{max}$. Each band control of the control interface shown in FIG. 11A is used to set one of a set of parameters denoted $\beta_i$, i=1 . . . 5 which in the drawing are expressed as percentage quantities $DEQ_1$, $DEQ_2$, ... $DEQ_5$.

While the implementation shown in FIGS. 11A-11C shows multiple frequency bands Band 1, Band 2, ..., Band 5 each having equal bandwidth and a consistent center frequency, in alternate embodiments, the control interface can include additional controls, such as a control for changing the respective center frequencies and bandwidths of the bands, similar to how a parametric equalizer provides such controls.

DEQ Processing According to Preset Device or Situation Specific Preset Spectral Profiles Other aspects of the invention include applying a DEQ preset spectral profiles that are specific to a pre-defined reproduction configuration and/or reproduction environment. One feature includes selecting, e.g., automatically selecting, e.g., automatically changing the preset to a DEQ preset spectral profile according to what a device is connected. Consider for example a portable media device such as an iPod (TM of Apple Inc., Cupertino, Calif.). There can be, for example, a pre-defined DEQ preset spectral profile for when the media device is connected to ("docked to") a home theater system, a pre-defined DEQ preset spectral profile for when the media device is connected to an automotive reproduction system, and yet another for listening to the media device output through headphones. Each reproduction situation provides a different experience and the appropriate DEQ preset spectral profile or preset profiles could be automatically selected or available for each situation. As an example, DEQ preset spectral profiles that boost very low levels of bass that are unlikely to be reproduced by smaller headphones may not be used or selected when playback is over headphones. Also a default DEQ preset spectral profile could be loaded by the system so that a consistent perceived spectral profile is provided to the user even though the reproduction method is varying.

An Integrated Controller for Dynamic Equalization Preset Selection and Control

The parameter β and a DEQ preset spectral profile EQ[b] (Eqn. 12 or Eqn. 18, depending on the type of DEQ) together provide a relatively simple manner that can be used in a media device to control the perceived spectrum of an audio signal. Furthermore, one of a plurality of pre-defined DEQ preset spectral profiles can be used, each for example applicable to a different reproduction situation or environment. One aspect of the present invention is a control interface that provides for a user a mechanism to easily select one of a set of pre-defined DEQ preset spectral profiles EQ[b] and to control the amount of DEQ being applied by controlling of the parameter β (Eqn. 12 or Eqn. 18, depending on the type of DEQ). Some versions include a mechanism to capture and store a desired spectral profile from an input audio signal. In one embodiment, the pre-defined DEQ preset spectral profiles are stored on a device. In another embodiment, universal resource locators (URLs) or pointers to the respective pre-defined DEQ preset spectral profiles are stored in the device.

In some embodiments, the control interface includes a display element for displaying a selection and an integrated element that provides for a control element for adjusting, e.g., adjusting the amount of DEQ to apply and a control element for indicating, e.g., for indicating a choice. As an example, in some embodiments, the control element for adjusting is a rotary control element, and the control element for indicating is by a click control element integrated with the rotary control element.

Figures 12A, 12B:
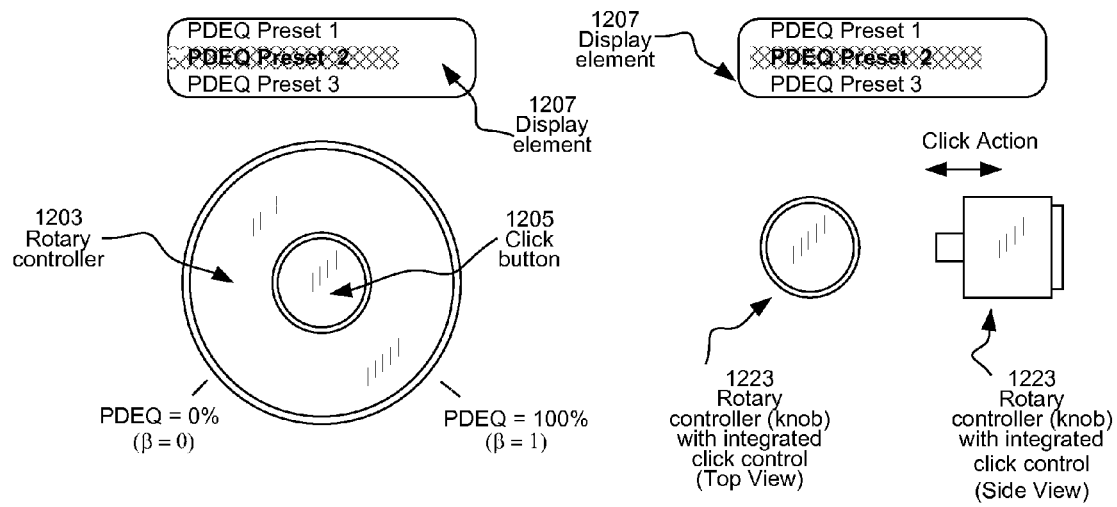
FIGS. 12A and 12B show two alternate embodiments of a control interface for integrated dynamic equalization control including selecting a dynamic equalization preset profile and varying the amount of dynamic equalization applied, according to some embodiments of the present invention.

FIGS. 12A and 12B show two alternate embodiments of a control interface for integrated DEQ control including selecting a DEQ preset profile and varying the amount of DEQ applied. FIG. 12A shows a control interface that includes an annular rotary controller 1203, which can be an actual physical controller, or a virtual controller in the form of a display with which a user can interact. The rotary control is used as the control element for adjusting. The control interface includes a region 1205 that acts as a push button, also commonly called a click button. The click button is used as the control element for indicating. In the particular arrangement shown, the click button 1205 fills the center void region of the annular rotary controller 1203. The control interface includes a display element 1207 configured to display actions being performed to provides a user visual feedback.

FIG. 12B shows one alternative control interface in which the rotary controller and selection mechanism are combined into element 1223: a rotary controller, e.g., a knob with integrated click control. A top view and a side view is shown in FIG. 12B, as is the display element 1207.

In some embodiments, the control interface with the integrated rotary controller and the click button (FIG. 12A or FIG. 12B) has a plurality of modes, including a selection mode in which the rotary controller is used to choose a particular pre-defined DEQ preset spectral profile of a plurality of pre-defined DEQ preset spectral profiles, and the click button is used to indicate applying the particular pre-defined DEQ preset spectral profile.

As one example, the modes include a control mode in which the rotary controller is used to control the amount of DEQ to apply, and the click button indicating is used to change modes. Furthermore, in some embodiments, the modes include a save mode in which the rotary controller is used to select a storage location to store a particular DEQ preset spectral profiles as one of the pre-defined spectral profiles, and the click button is used both to change modes and to save the particular DEQ preset spectral profiles as one of the pre-defined spectral profiles at the selected storage location.

Figure 13:
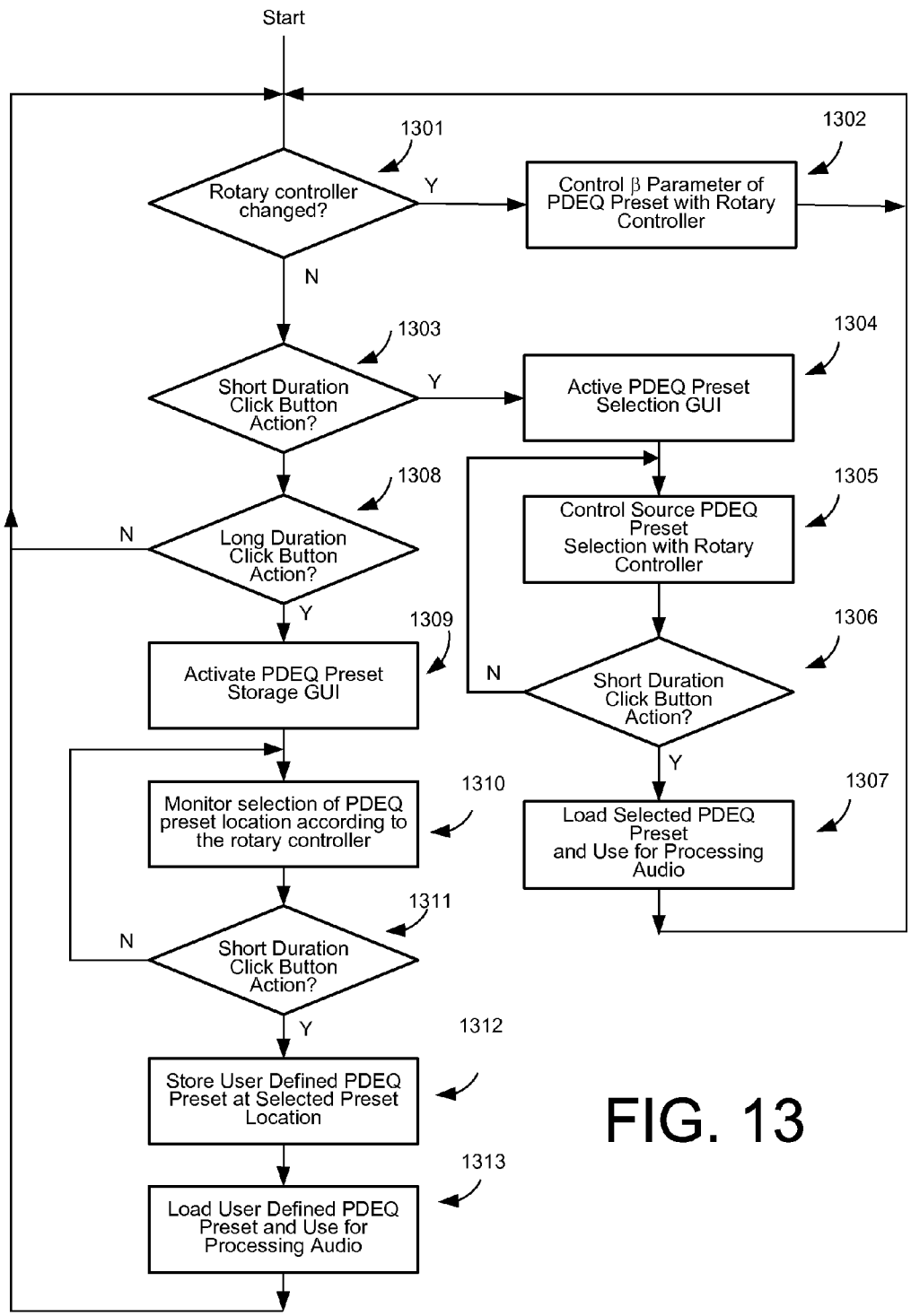
FIG. 13 shows a simplified flow chart of an embodiment of controlling an audio signal processing apparatus using control interface for integrated dynamic equalization control such as shown in FIG. 12A or 12B to vary the amount of dynamic equalization to apply, to select one of a set of predefined dynamic equalization preset spectral profiles, and to define and save a dynamic equalization preset spectral profile, in accordance to some embodiments of the present invention.

FIG. 13 shows a simplified flow chart of how an embodiment of an integrated DEQ controller can be used for the selection, creation and storage of DEQ preset spectral profiles.

The flowchart in FIG. 13 assumes that a DEQ preset spectral profile has been selected by the DEQ processing function and is actively processing the audio signal. When a preset is being applied, the user can control the amount of DEQ being applied. In the example above, it is assumed that the user control is that of the parameter $\beta$ which was outlined above in FIGS. 4A and 4B.

In one embodiment, the click control provides one of several actions depending on the length of depression. In an alternate embodiment, a single click and two clicks in rapid succession are used, as is common in modern computer interfaces, such as Microsoft Windows, Apple's OS X, etc.

While the method processes the audio signal including applying the DEQ preset spectral profile, the method continually monitors for three types of user input: a change in the rotary position, and two types of user input provided by the center click button in the embodiment of FIG. 12A and the rotary controller click action in the embodiment of FIG. 12B. The two different click actions are a click action of the first kind and a click action of the second kind.

The monitoring is shown by blocks 1301, 1303, and 1308. While sequential monitoring is shown in FIG. 13, in alternate embodiments, the monitoring may be carried out by parallel monitoring, and by interrupt mechanisms, as is common skilled in the art.

The method includes in 1301 monitoring for change in position of the rotary controller, and in 1302, if the position is changed, applying a new $\beta$ according to the new position of the rotary controller.

Suppose the length of depression is used to differentiate between the click action of the first kind and the click action of the second kind, and suppose the method is configured to differentiate between a short duration click action—the click action of the first kind, and a long duration "click and hold" action—the click action of the second kind. The method includes in 1303 monitoring for a short duration click action, and in 1308 monitoring for a long duration click action.

In one implementation, the click action of the first kind—the short duration click action indicates the user's desire to audition and select a new DEQ preset spectral profile. This is indicated by decision block 1303 branching to Y (yes) on the right. In 1304 a DEQ preset spectral profile selection graphical user interface (GUI) is presented to the user (activated). In one embodiment, the GUI includes a multi-line display (LED or LCD) as shown in FIGS. 12A and 12B. While the DEQ preset spectral profile selection GUI is active, the rotary controller now controls the DEQ preset spectral profile selection in the GUI instead of the parameter $\beta$ of, e.g., Eqn. 12 or Eqn. 18 depending on the type of DEQ. The user selects and auditions various DEQ preset spectral profiles by rotating the rotary controller, each change causing a different DEQ preset spectral profile to be used for processing. 1305 includes detecting if there is a change in the position of the rotary controller, and if so, using the selected DEQ preset spectral profile to process the audio signal. When the listener wishes to load a currently being used profile, the user so indicated with a click action of the first kind—the short duration click action. Step 1306 monitors for the short duration click action and repeats monitoring for a change in the rotary controller until there is a short duration click action. If a short duration click action is identified by the method in 1306, indicating the user's desire to load the currently selected preset, 1307 includes loading the selected DEQ preset spectral profile, using the loaded DEQ preset spectral profile for audio signal processing, and returning the flowchart to the start or step 1301.

While the method returns to processing the audio signal, applying the DEQ preset spectral profile, the method again monitors for the three types of user input provided by the rotary controller and the click action actuator.

In one implementation, the click action of the second kind—the long duration click action indicates the user's desire to create a new DEQ preset spectral profile based on the spectral profile of the audio signal currently being processed and monitored. This is indicated by decision block 1308 branching to Y (yes) in the downward direction. In 1309 a DEQ preset spectral profile storage GUI is activated. In some embodiments, this takes on the simple form shown in FIGS. 12A and 12B. In some embodiments, while the DEQ preset spectral profile storage GUI is active, the rotary controller is configured to control the DEQ preset spectral profile storage location, indicated by an index number in the GUI, instead of controlling the parameter $\beta$. In 1310 the rotary controller is monitored while the user selects a PREQ preset location. In some embodiments, while the DEQ preset spectral profile storage GUI is active, a short duration click action is used to indicate to the method the user's desire to store the DEQ spectral profile of the current audio signal being monitored in the selected DEQ preset spectral profile location. 1311 includes monitoring for a short duration click action. Such an action occurring is indicated by decision block 1311 branching to Y (yes) in the downward direction. 1312 includes storing the DEQ spectral profile of the current audio signal being monitored in the selected DEQ preset spectral profile location. 1313 includes loading and using the just stored DEQ spectral profile for audio signal processing, which then returns the process to the monitoring of processing the audio signal while monitoring for rotary or clock actions.

It should be noted that additional functionality is also possible, including the creation of custom preset names. This functionality may also be implemented as a virtual version of FIGS. 4A and 4B, for example one that is rendered via touch sensitive graphical user interface such as those integrated with computers and portable media players.

Unless specifically stated otherwise, as apparent from the following description, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps is implied, unless specifically stated.

In some embodiments, a computer-readable storage medium is configured with, e.g., encoded with instructions that when executed by one or more processors of a processing system such as a digital signal processing device or subsystem that includes at least one processor element and a storage subsystem, cause carrying out a method as described herein.

The methodologies described herein are, in some embodiments, performable by one or more processors that accept logic, instructions encoded on one or more computer-readable media. When executed by one or more of the processors, the instructions cause carrying out at least one of the methods described herein. Any processor capable of executing a set of instructions (sequential or otherwise) that specify actions to be taken are included. Thus, one example is a typical processing system that includes one or more processors. Each processor may include one or more of a CPU or similar element, a graphics processing unit, and/or a programmable DSP unit. The processing system further may include storage subsystem that includes a memory subsystem including main RAM and/or a static RAM, and/or ROM. A bus subsystem may be included for communicating between the components. The processing system further may be a distributed processing system with processors coupled by a network, e.g., via network interface devices or wireless network interface devices. If the processing system requires a display, such a display may be included, e.g., a liquid crystal display (LCD), organic light emitting display (OLED), or a cathode ray tube (CRT) display. If manual data entry is required, the processing system also includes an input device such as one or more of an alphanumeric input unit such as a keyboard, a pointing control device such as a mouse, and so forth. The term storage device, storage subsystem, or memory unit as used herein, if clear from the context and unless explicitly stated otherwise, also encompasses a storage system such as a disk drive unit. The processing system in some configurations may include a sound output device, and a network interface device. The memory subsystem thus includes a computer-readable medium that is configured with, e.g., encoded with instructions, e.g., logic, e.g., software that when executed by one or more processors, causes carrying out one of more of the method steps described herein. The software may reside in the hard disk, or may also reside, completely or at least partially, within the RAM and/or within the processor during execution thereof by the computer system. Thus, the memory and the processor also constitute computer-readable medium on which are encoded instructions.

Furthermore, a computer-readable medium may form a computer program product, or be included in a computer program product.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The term processing system encompasses all such possibilities, unless explicitly excluded herein. The one or more processors may form a personal computer (PC), a media playback device, a tablet PC, a set-top box (STB), a Personal Digital Assistant (PDA), a cellular telephone, a Web appliance, a network router, switch or bridge, or any machine capable of executing a set of instructions (sequential or otherwise) that specify actions to be taken by that machine.

Note that while some diagram(s) only show(s) a single processor and a single storage subsystem, e.g., a single memory that stores the logic including instructions, those skilled in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer-readable medium configured with a set of instructions, e.g., a computer program that when executed on one or more processors, e.g., one or more processors that are part of a media device, cause carrying out of method steps. Thus, as will be appreciated by those skilled in the art, embodiments of the present invention may be embodied as a method, an apparatus such as a special purpose apparatus, an apparatus such as a data processing system, or a computer-readable storage medium, e.g., as a computer program product. The computer-readable medium is configured with a set of instructions that when executed by one or more processors cause carrying out method steps. Accordingly, aspects of the present invention may take the form of a method, an entirely hardware embodiment, an entirely software embodiment or an embodiment combining software and hardware aspects. Furthermore, the present invention may take the form of computer readable medium, e.g., a computer program product as a computer-readable storage medium with computer-readable program code embodied in the medium.

While the computer readable medium is shown in an example embodiment to be a single medium, the term "computer readable medium" should be taken to include a single medium or multiple media, e.g., a centralized storage device for a centralized database, or distributed storage for a distributed database, and/or associated caches and servers that store the one or more sets of instructions. The term "computer readable medium" shall also be taken to include any tangible storage medium that is capable of storing or encoding instructions for execution by one or more of the processors and that cause the one or more processors to perform method steps of any one or more of the methodologies of the present invention. A computer readable medium may take many forms, including but not limited to, non-volatile media and/or volatile media. Non-volatile media includes, for example, optical storage, magnetic disks, and/or magneto-optical disks. Volatile media includes dynamic memory, such as main memory. For example, the term "computer readable medium" shall accordingly be taken to be included, but not be limited to, in one set of embodiment, a tangible computer-readable medium, e.g., a solid-state memory, or a computer software product encoded in computer-readable optical or magnetic media.

It will be understood that the steps of methods discussed are performed in one embodiment by an appropriate processor (or processors) of a processing (i.e., computer) system executing instructions stored in storage. It will also be understood that embodiments of the present invention are not limited to any particular implementation or programming technique and that the invention may be implemented using any appropriate techniques for implementing the functionality described herein. Furthermore, embodiments are not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill skilled in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patents, U.S. patent applications, and International (PCT) patent applications designating the United States cited herein are hereby incorporated by reference. In the case the Patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting of only elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of operating an audio signal processing apparatus to process an audio signal, the method comprising:

presenting a control interface to the user, the control interface including one or more control elements configured to accept a user input including user input that defines respective one or more values for at least some of a set of one or more blending parameters, the set of one or more blending parameters determining a user-defined dynamic equalization (DEQ) spectral profile based on a blending of two or more selected DEQ preset spectral profiles;

determining from or accepting from the output of the control interface the user-defined dynamic equalization (DEQ) spectral profile based on a blending of two or more selected DEQ preset spectral profiles, the blending based on the set of one or more blending parameters, wherein each DEQ spectral profile comprises a set of measures for each band of a perceptually spaced set of frequency bands; and processing an audio signal according to the user-defined DEQ spectral profile to generate a processed audio signal, the processing including determining a spectral measure that is modified to dynamically adjust the time-varying spectrum of the audio signal to more closely match a time invariant spectral profile according to the user-defined DEQ spectral profile, wherein determining the time-varying spectrum comprises determining the specific loudness for the perceptually spaced set of frequency bands;

wherein the processing includes perceptual domain dynamic equalization (PDEQ) to dynamically adjust the time-varying spectrum of the audio signal to more closely match the time invariant spectral profile according to the user-defined DEQ spectral profile, and wherein the blending is of a plurality of stored DEQ preset spectral profiles in the perceptually spaced set of frequency bands.

2. A method as recited in claim 1, wherein the control interface further includes at least one control element for selecting or otherwise defining one or more of the plurality of selected DEQ preset spectral profiles.

3. A method as recited in claim 1, wherein the blending is of one or more pairs of selected DEQ preset spectral profiles, and wherein the control interface includes a control element for setting one or more blending parameters to determine the respective relative amounts of blending of respective one or more pairs of the selected DEQ preset spectral profiles to form the user-defined DEQ spectral profile.

4. A method as recited in claim 3, wherein the blending of each pair of selected DEQ preset spectral profiles is a linear combination of the pair of selected DEQ preset spectral profiles.

5. A method as recited in claim 3, wherein the blending of each pair of selected DEQ preset spectral profiles is a nonlinear combination of the pair of selected DEQ preset spectral profiles.

6. A method as recited in claim 1, wherein the one or more control elements include:
one or more virtual or actual slider controls, or one or more virtual or actual rotary controls.

7. A method as recited in claim 1, wherein the control interface includes a two dimensional control element configured to accept a user indication of a location on a control surface of the two-dimensional control element, and wherein the indicated location defines respective relative amounts of blending of a respective DEQ preset spectral profile to form the user-defined DEQ spectral profile.

8. A method as recited in claim 1, wherein the user defined DEQ spectral profile is based on a selected DEQ preset spectral profile specific to a pre-defined reproduction configuration and/or a pre-defined reproduction environment.

9. A method as recited in claim 8, further comprising automatically selecting the specific selected DEQ preset spectral profile according to the reproduction configuration and/or a reproduction environment.

10. A method as recited in claim 1, wherein the control interface includes a display element for displaying a selection and an integrated element that includes a control element for adjusting, and a control element for indicating.

11. A method as recited in claim 10, wherein the control interface has a plurality of modes, including a selection mode wherein the control element for adjusting is used to choose a particular pre-defined DEQ preset spectral profile of a plurality of pre-defined DEQ preset spectral profiles, and the control element for indicating is used to indicate applying the particular pre-defined DEQ preset spectral profile.

12. A method as recited in claim 11, wherein the modes include a control mode wherein the control element for adjusting is used to control the amount of DEQ to apply, and the control element for indicating is used to change modes.

13. A method as recited in claim 11, wherein the modes include a save mode wherein the control element for adjusting is used to select a storage location to store a particular DEQ preset spectral profile as one of the pre-defined spectral profiles, and wherein the control element for indicating is used both to change modes and to save the particular DEQ preset spectral profiles as one of the pre-defined spectral profiles at the selected storage location.

14. A non-transitory computer-readable medium configured with instructions that when executed by one or more processors of a media processing apparatus cause carrying out a method comprising:
presenting a control interface to the user, the control interface including one or more control elements configured to accept a user input including user input that defines respective one or more values for at least some of a set of one or more blending parameters, the set of one or more blending parameters determining a user-defined dynamic equalization (DEQ) spectral profile based on a blending of two or more selected DEQ preset spectral profiles;
determining from or accepting from the control interface a user-defined dynamic equalization (DEQ) spectral profile based on a blending of two or more selected DEQ preset spectral profiles, the blending based on the set of one or more blending parameters, wherein each DEQ spectral profile comprises a set of measures for each band of a perceptually spaced set of frequency bands; and
processing an audio signal according to the user-defined DEQ spectral profile to generate a processed audio signal, the processing including determining a spectral measure that is modified to dynamically adjust the time-varying spectrum of the audio signal to more closely match a time invariant spectral profile according to the user-defined DEQ spectral profile,
wherein determining the time-varying spectrum comprises determining the specific loudness for the perceptually spaced set of frequency bands;
wherein the processing includes perceptual domain dynamic equalization (PDEQ) to dynamically adjust the time-varying spectrum of the audio signal to more closely match the time invariant spectral profile according to the user-defined DEQ spectral profile,
and wherein the blending is of a plurality of stored DEQ preset spectral profiles in the perceptually spaced set of frequency bands.

15. A media processing apparatus comprising:
one or more processors; and
a control interface coupled to at least one of the one or more processors, the control interface including one or more control elements configured to accept a user input;
a storage subsystem coupled to at least one of the one or more processors and containing code that when executed cause at least one of the one or more processors to:
accept from a user via the control interface input that defines respective one or more values for at least some of a set of one or more blending parameters, the set of one or more blending parameters determining a user-defined dynamic equalization (DEQ) spectral profile based on a blending of two or more selected DEQ preset spectral profiles;
determine from or accept from the output of the control interface the user-defined DEQ spectral profile based on a blending of two or more selected DEQ preset spectral profiles, the blending based on the set of one or more blending parameters, wherein each DEQ spectral profile comprises a set of measures for each band of a perceptually spaced set of frequency bands; and
process an audio signal according to the user-defined DEQ spectral profile to generate a processed audio signal, the processing including determining a spectral measure that is modified to dynamically adjust the time-varying spectrum of the audio signal to more closely match a time invariant spectral profile according to the user-defined DEQ spectral profile,
wherein determining the time-varying spectrum comprises determining the specific loudness for the perceptually spaced set of frequency bands;
wherein the processing includes perceptual domain dynamic equalization to dynamically adjust the time-varying spectrum of the audio signal to more closely match the time invariant spectral profile according to the user-defined DEQ spectral profile,
and wherein the blending is of a plurality of stored DEQ preset spectral profiles in the perceptually spaced set of frequency bands.

16. A media processing apparatus as recited in claim 15, wherein the control interface further includes at least one control element for selecting or otherwise defining one or more of the plurality of selected DEQ preset spectral profiles.

17. A media processing apparatus as recited in claim 15, wherein the blending is of one or more pairs of selected DEQ preset spectral profiles, and wherein the control interface includes a control element for setting one or more blending parameters to determine the respective relative amounts of blending of respective one or more pairs of the selected DEQ preset spectral profiles to form the user-defined DEQ spectral profile.

18. A media processing apparatus as recited in claim 17, wherein the blending of each pair of selected DEQ preset spectral profiles is a linear combination of the pair of selected DEQ preset spectral profiles.

19. A media processing apparatus as recited in claim 17, wherein the blending of each pair of selected DEQ preset spectral profiles is a nonlinear combination of the pair of selected DEQ preset spectral profiles.

20. A media processing apparatus as recited in claim 16, wherein the one or more control elements include one or more virtual or actual slider controls, or one or more virtual or actual rotary controls.

21. A media processing apparatus as recited in claim 15, wherein the control interface includes a two dimensional control element configured to accept a user indication of a location on a control surface of the two-dimensional control element, and wherein the indicated location defines respective relative amounts of blending of a respective DEQ preset spectral profiles to form the user-defined DEQ spectral profile.

22. A media processing apparatus as recited in claim 15, wherein the user defined DEQ spectral profile is based on a selected DEQ preset spectral profile specific to a pre-defined reproduction configuration and/or a pre-defined reproduction environment.

23. A media processing apparatus as recited in claim 22, further comprising automatically selecting the specific selected DEQ preset spectral profile according to the reproduction configuration and/or a reproduction environment.

24. A media processing apparatus as recited in claim 15, wherein the control interface includes a display element for displaying a selection and an integrated element that includes a control element for adjusting, and a control element for indicating.

25. A media processing apparatus as recited in claim 24, wherein the control interface has a plurality of modes, including a selection mode wherein the control element for adjusting is used to choose a particular pre-defined DEQ preset spectral profile of a plurality of pre-defined DEQ preset spectral profiles, and the control element for indicating is used to indicate applying the particular pre-defined DEQ preset spectral profile.

26. A media processing apparatus as recited in claim 25, wherein the modes include a control mode wherein the control element for adjusting is used to control the amount of DEQ to apply, and the control element for indicating is used to change modes.

27. A media processing apparatus as recited in claim 25, wherein the modes include a save mode wherein the control element for adjusting is used to select a storage location to store a particular DEQ preset spectral profiles as one of the pre-defined spectral profiles, and wherein the control element for indicating is used both to change modes and to save the particular DEQ preset spectral profiles as one of the pre-defined spectral profiles at the selected storage location.

* * * * *